(12) United States Patent
Yamazaki et al.

(10) Patent No.: US 11,652,122 B2
(45) Date of Patent: May 16, 2023

(54) IMAGING ELEMENT, METHOD OF MANUFACTURING IMAGING ELEMENT, IMAGING DEVICE, AND METHOD OF MANUFACTURING IMAGING DEVICE

(71) Applicant: SONY SEMICONDUCTOR SOLUTIONS CORPORATION, Kanagawa (JP)

(72) Inventors: Tomohiro Yamazaki, Kanagawa (JP); Yasushi Maruyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 173 days.

(21) Appl. No.: 17/090,009

(22) Filed: Nov. 5, 2020

(65) Prior Publication Data

US 2021/0057475 A1    Feb. 25, 2021

Related U.S. Application Data

(62) Division of application No. 15/766,587, filed as application No. PCT/JP2016/004434 on Sep. 30, 2016, now Pat. No. 10,930,691.

(30) Foreign Application Priority Data

Oct. 14, 2015    (JP) .................................. 2015-202659

(51) Int. Cl.
    *H01L 27/146*    (2006.01)

(52) U.S. Cl.
    CPC .... *H01L 27/14629* (2013.01); *H01L 27/1464* (2013.01); *H01L 27/14621* (2013.01);
(Continued)

(58) Field of Classification Search
    CPC ................................................ H01L 27/14685
(Continued)

(56) References Cited

U.S. PATENT DOCUMENTS

| 10,930,691 B2 | 2/2021 | Yamazaki et al. |
| 2010/0201834 A1 | 8/2010 | Watanabe et al. |

(Continued)

FOREIGN PATENT DOCUMENTS

| CN | 202454558 | 9/2012 |
| CN | 102779823 | 11/2012 |

(Continued)

OTHER PUBLICATIONS

International Search Report and Written Opinion prepared by the European Patent Office dated Dec. 19, 2016, for International Application No. PCT/JP2016/004434.
(Continued)

*Primary Examiner* — Hsin Yi Hsieh
(74) *Attorney, Agent, or Firm* — Sheridan Ross PC

(57) ABSTRACT

There is provided a method of manufacturing an imaging device including a plurality of imaging elements in an imaging area, where each imaging element includes a photoelectric conversion unit in a substrate and a wire grid polarizer arranged at a light-incident side of the photoelectric conversion unit. The method generally includes forming the wire grid polarizer that includes a plurality of stacked strip-shaped portions, where each of the plurality of stacked strip-shaped portions includes a portion of a light-reflecting layer and a portion of a light-absorbing layer. The light-reflecting layer may include a first electrical conducting material that is electrically connected to at least one of the substrate or the photoelectric conversion unit. The light-absorbing layer may include a second electrical conducting
(Continued)

material, where at least a portion of the light-absorbing layer is in contact with the light-reflecting layer.

20 Claims, 26 Drawing Sheets

(52) U.S. Cl.
CPC .. *H01L 27/14623* (2013.01); *H01L 27/14625* (2013.01); *H01L 27/14627* (2013.01); *H01L 27/14645* (2013.01); *H01L 27/14685* (2013.01)

(58) Field of Classification Search
USPC .......................................................... 438/65
See application file for complete search history.

(56) References Cited

U.S. PATENT DOCUMENTS

| | | | |
|---|---|---|---|
| 2012/0168889 A1 | 7/2012 | Ooka | |
| 2012/0287297 A1 | 11/2012 | Fukuda | |
| 2012/0319222 A1 | 12/2012 | Ozawa et al. | |
| 2015/0141753 A1* | 5/2015 | Kanamori | H01L 27/14627 600/109 |

FOREIGN PATENT DOCUMENTS

| | | |
|---|---|---|
| CN | 104253054 | 12/2014 |
| JP | 2003-143488 | 5/2003 |
| JP | 2010-072591 | 4/2010 |
| JP | 2011-176297 | 9/2011 |
| JP | 2012-080065 | 4/2012 |
| JP | 2012-238632 | 12/2012 |
| WO | WO 2012-032939 | 3/2012 |
| WO | WO 2015/049981 | 4/2015 |

OTHER PUBLICATIONS

Official Action (with English translation) for Japanese Patent Application No. 2015-202659, dated Aug. 27, 2019, 6 pages.
Official Action for U.S. Appl. No. 15/766,587, dated Apr. 4, 2019.
Official Action for U.S. Appl. No. 15/766,587, dated Feb. 20, 2020.
Official Action for U.S. Appl. No. 15/766,587, dated May 14, 2020.
Notice of Allowance for U.S. Appl. No. 15/766,587, dated Oct. 28, 2020.
Notice of Allowance for U.S. Appl. No. 15/766,587, dated Dec. 2, 2020.

* cited by examiner

IMAGING ELEMENT, METHOD OF MANUFACTURING IMAGING ELEMENT, IMAGING DEVICE, AND METHOD OF MANUFACTURING IMAGING DEVICE

CROSS REFERENCE TO RELATED APPLICATIONS

This application is a divisional of U.S. patent application Ser. No. 15/766,587 filed Apr. 6, 2018, which is a national stage application under 35 U.S.C. 371 and claims the benefit of PCT Application No. PCT/JP2016/004434 having an international filing date of Sep. 30, 2016, which designated the United States, which PCT application claimed the benefit of Japanese Priority Patent Application JP 2015-202659 filed Oct. 14, 2015, the entire disclosures of each of which are incorporated herein by reference.

TECHNICAL FIELD

The present disclosure relates to imaging elements, methods of manufacturing the imaging element, imaging devices, and methods of manufacturing the imaging device.

BACKGROUND ART

For example, according to JP2012-238632A, an imaging device having a plurality of imaging elements with wire grid polarizers (WGPs) is well known. For example, a photoelectric conversion area includes a charge-coupled device (CCD) or a complementary metal-oxide-semiconductor (CMOS) image sensor. The photoelectric conversion area is included in a photoelectric conversion unit in the imaging element and generates current on the basis of incident light. The wire grid polarizer is arranged at a light-incident side of the photoelectric conversion unit. For example, in the wire grid polarizer, a plurality of band-like light-reflecting layers, insulating layers, and light-absorbing layers are separately placed side by side. The light-absorbing layer made of a second electrical conducting material is positioned at the light-incident side, and the light-reflecting layer made of a first electrical conducting material is positioned at the photoelectric conversion unit side.

As illustrated in a conceptual diagram in FIG. 25, a wire grid selectively reflects/absorbs electromagnetic waves oscillating at surfaces parallel to a wire grid extending direction in a case where a pitch $P_0$ at which the wire grid has been formed is significantly smaller than an effective wavelength of the incident electromagnetic waves. Therefore, as illustrated in FIG. 25, although the electromagnetic waves, before reaching the wire grid polarizer, include a vertical polarization component and a horizontal polarization component, the vertical polarization component becomes a dominant linear polarization in the electromagnetic waves passed through the wire grid polarizer. When focusing on a visible light wavelength band, a surface of the wire grid reflects or absorbs a polarization component biased toward a surface parallel to the wire grid extending direction in the case where the pitch $P_0$ at which the wire grid has been formed is significantly smaller than the effective wavelength of the electromagnetic waves incident on the wire grid polarizer. On the other hand, when an electromagnetic wave having a polarization component biased toward a surface perpendicular to the wire grid extending direction enters the wire grid, an electric field propagates a front surface of the wire grid, and the electric field having the same wavelength and the same polarization orientation as the incident wavelength exits from a rear surface of the wire grid.

CITATION LIST

Patent Literature

[PTL 1]
JP 2012-238632A

SUMMARY

Technical Problem

In manufacturing the wire grid polarizer, a light-reflecting layer-forming layer made of a first electrical conducting material, an insulating layer, and a light-absorbing layer-forming layer made of a second electrical conducting material are formed in this order on a photoelectric conversion unit, and subsequently the light-reflecting layer-forming layer, the insulating layer, and the light-absorbing layer-forming layer are etched. When such a wire grid polarizer is manufactured, the light-reflecting layer-forming layer and the light-absorbing layer-forming layer are in a floating state (state in which layers are not electrically connected anywhere). Therefore, during film formation or an etching process, the light-reflecting layer-forming layer or the light-absorbing layer-forming layer may be charged and a kind of discharge may occur. Unfortunately, the wire grid polarizer and the photoelectric conversion unit may be damaged. For example, in the technology disclosed in JP 2012-238632A, a wire grid polarizer is formed and then a conductive layer is formed on all surfaces of the wire grid polarizer. Therefore, it is difficult to prevent a light-reflecting layer-forming layer or a light-absorbing layer-forming layer from being charged during film formation or an etching process. In the technology disclosed in JP 2012-238632A, formation of a conductive layer prevents electrostatic dust and so on from adhering after forming the wire grid polarizer in an imaging device. The adhesion of the electrostatic dust and so on is liable to occur before the imaging device is sealed by a transparent lid member in a packaging process.

Therefore, embodiments of the present disclosure provide an imaging element, a method of manufacturing the imaging element, an imaging device, and a method of manufacturing the imaging device that have structures or configurations capable of suppressing discharge during manufacturing a wire grid polarizer.

Solution to Problem

According to an embodiment of the present disclosure, there is provided a method of manufacturing an imaging device including a plurality of imaging elements in an imaging area, each of the imaging elements including a photoelectric conversion unit on a substrate, and a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer, the method including:

manufacturing each of the imaging elements by (a) forming a light-reflecting layer-forming layer made of a first electrical conducting material on the photoelectric conversion unit after forming the photoelectric conversion unit, (b) next, on or above the light-reflecting layer-forming layer, forming a light-absorbing layer-forming layer which is made of a second electrical conducting material and at least a part of which is in contact with the light-reflecting layer-forming layer, and (c) subsequently, patterning the light-absorbing layer-forming layer and the light-reflecting layer-forming layer to obtain the wire grid polarizer in which the plurality of stacked structures are separately placed side by side, each of the stacked structures including the band-like light-reflecting layer and the band-like light-absorbing layer. In (a), the light-reflecting layer-forming layer made of the first electrical conducting material is electrically connected to the substrate or the photoelectric conversion unit.

According to an embodiment of the present disclosure, there is provided a method of manufacturing an imaging element including a photoelectric conversion unit on a substrate, and a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer, the method including:

(A) after forming the photoelectric conversion unit, forming a light-reflecting layer-forming layer which is made of a first electrical conducting material and which is electrically connected to the substrate or the photoelectric conversion unit, on the photoelectric conversion unit;

(B) next, on or above the light-reflecting layer-forming layer, forming a light-absorbing layer-forming layer which is made of a second electrical conducting material and at least a part of which is in contact with the light-reflecting layer-forming layer; and (C) subsequently, patterning the light-absorbing layer-forming layer and the light-reflecting layer-forming layer to obtain the wire grid polarizer in which the plurality of stacked structures are separately placed side by side, each of the stacked structures including the band-like light-reflecting layer and the band-like light-absorbing layer.

According to an embodiment of the present disclosure, there is provided an imaging device including a plurality of imaging elements in an imaging area, each of the imaging elements including a photoelectric conversion unit on a substrate, and a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer.

The light-reflecting layer is made of a first electrical conducting material, the light-absorbing layer is made of a second electrical conducting material, and an extending part of the light-reflecting layer is electrically connected to the substrate or the photoelectric conversion unit.

According to an embodiment of the present disclosure, there is provided an imaging element including:

a photoelectric conversion unit on a substrate; and a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer.

The light-reflecting layer is made of a first electrical conducting material, the light-absorbing layer is made of a second electrical conducting material, and an extending part of the light-reflecting layer is electrically connected to the substrate or the photoelectric conversion unit.

According to an embodiment of the present disclosure, there is provided a method of manufacturing an imaging device including a plurality of imaging elements in an imaging area, each imaging element including a photoelectric conversion unit in a substrate and a wire grid polarizer arranged at a light-incident side of the photoelectric conversion unit, the method including: forming the photoelectric conversion unit in the substrate; forming a light-reflecting layer on or above the photoelectric conversion unit, wherein the light-reflecting layer includes a first electrical conducting material that is electrically connected to at least one of the substrate or the photoelectric conversion unit; forming a light-absorbing layer on or above the light-reflecting layer, wherein the light-absorbing layer includes a second electrical conducting material, and wherein at least a portion of the light-absorbing layer is in contact with the light-reflecting layer; and patterning the light-absorbing layer and the light-reflecting layer to form a wire grid polarizer including a plurality of stacked strip-shaped portions, wherein each of the plurality of stacked strip-shaped portions includes a portion of the light-reflecting layer and a portion of the light-absorbing layer.

According to an embodiment of the present disclosure, there is provided an imaging element including: a photoelectric conversion unit in a substrate; a wire grid polarizer disposed at a light-incident side of the photoelectric conversion unit, the wire grid polarizer including a plurality of stacked strip-shaped portions, each stacked strip-shaped portion including a light-reflecting layer and a light-absorbing layer; and an extending portion of the light-reflecting layer electrically connected to the substrate or the photoelectric conversion unit, wherein, the light-reflecting layer includes a first electrical conducting material, and the light-absorbing layer includes a second electrical conducting material.

According to an embodiment of the present disclosure, there is provided animaging device including: a plurality of imaging elements in an imaging area, each imaging element including: a photoelectric conversion unit in a substrate; a wire grid polarizer disposed at a light-incident side of the photoelectric conversion unit, the wire grid polarizer including a plurality of stacked strip-shaped portions, each stacked strip-shaped portion including a light-reflecting layer and a light-absorbing layer; and an extending portion of the light-reflecting layer electrically connected to the substrate or the photoelectric conversion unit, wherein, the light-reflecting layer includes a first electrical conducting material, and the light-absorbing layer includes a second electrical conducting material.

Advantageous Effects of Invention

In the imaging element obtained by the method of manufacturing an imaging element according to embodiments of the present disclosure, the imaging element obtained by the method of manufacturing an imaging device according to the embodiments of the present disclosure, the imaging element according to the embodiments of the present disclosure, and the imaging element included in the imaging device according to the embodiments of the present disclosure, the light-reflecting layer-forming layer is electrically connected to the substrate or the photoelectric conversion unit, the light-reflecting layer-forming layer electrically connected to the substrate or the photoelectric conversion unit is prepared, and the extending part of the light-reflecting layer is electrically connected to the substrate or the photoelectric conversion unit. Therefore, during formation of the wire grid polarizer, it is certainly possible to prevent the wire grid polarizer and the photoelectric conversion unit from being damaged after light-reflecting layer-forming layer or the light-absorbing layer-forming layer is charged and a kind of discharge occurs. The effects described in this specification are just examples and are not limitations. There may be additional effects.

DESCRIPTION OF EMBODIMENTS

Figure 1:
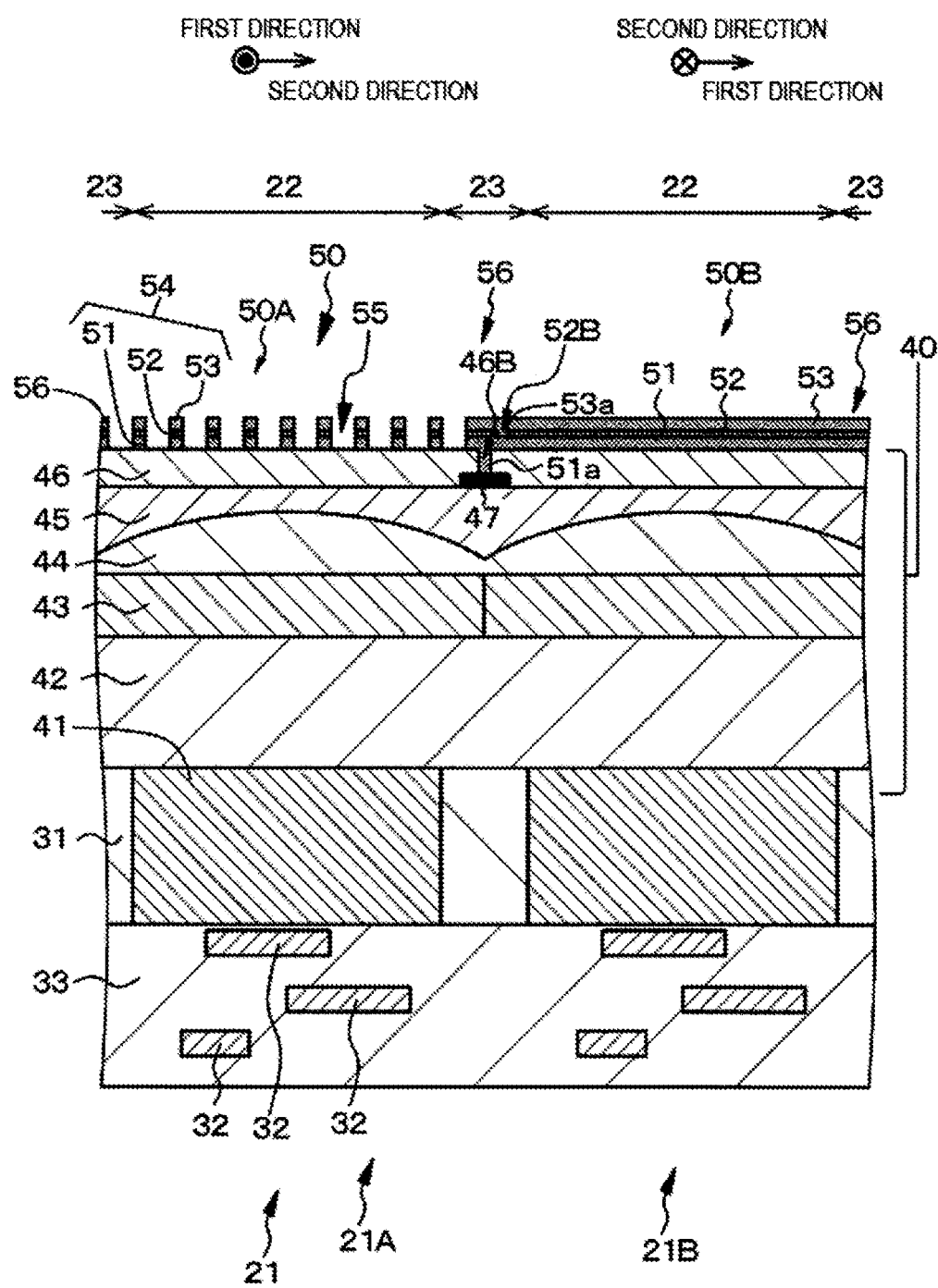
FIG. 1 is a schematic partial end view of imaging elements in an imaging device according to a first embodiment.

Hereinafter, with reference to the drawings, the present disclosure will be described based on embodiments, which are not intended to limit the present disclosure and in which different values and materials are by way of example only. Note that the description is given in the following order.

1. General description of imaging element, method of manufacturing imaging element, imaging device, and method of manufacturing imaging device according to embodiments of the present disclosure
2. First embodiment (imaging element, method of manufacturing imaging element, imaging device, and method of manufacturing imaging device according to embodiment of present disclosure (imaging element A according to embodiment of present disclosure))
3. Second embodiment (modification of first embodiment (imaging element B according to embodiment of present disclosure))
4. Other Case <General Description of Imaging Element, Method of Manufacturing Imaging Element, Imaging Device, and Method of Manufacturing Imaging Device According to Embodiments of Present Disclosure>

In an imaging device and an imaging element obtained by a method of manufacturing the imaging device according to the embodiments of the present disclosure, a light-reflecting layer and a light-absorbing layer may be shared by the imaging elements.

According to the method of manufacturing an imaging device in the embodiments of the present disclosure including a preferable embodiment, in the step (b), the light-absorbing layer-forming layer made of the second electrical conducting material can be formed on or above the light-reflecting layer-forming layer in a state in which potential of the light-reflecting layer-forming layer is set to a predetermined potential via the substrate or the photoelectric conversion unit, and in the step (c), the light-absorbing layer-forming layer and the light-reflecting layer-forming layer can be patterned in a state in which the potential of the light-reflecting layer-forming layer is set to a predetermined potential via the substrate or the photoelectric conversion unit.

In addition, according to the method of manufacturing an imaging element in the embodiments of the present disclosure including a preferable embodiment, in the step (B), the light-absorbing layer-forming layer made of the second electrical conducting material can be formed on or above the light-reflecting layer-forming layer in a state in which potential of the light-reflecting layer-forming layer is set to a predetermined potential via the substrate or the photoelectric conversion unit, and in the step (C), the light-absorbing layer-forming layer and the light-reflecting layer-forming layer can be patterned in a state in which the potential of the light-reflecting layer-forming layer is set to a predetermined potential via the substrate or the photoelectric conversion unit.

In the method of manufacturing an imaging device according to the embodiments of the present disclosure including a preferable embodiment, an area in which the substrate or the photoelectric conversion unit is electrically connected to the light-reflecting layer-forming layer may be positioned in an imaging area, may be positioned in an optical black pixel area (OPB) at an outer circumference of the imaging area, or may be positioned in a peripheral area outside the imaging area. In the imaging device according to the embodiments of the present disclosure, an area in which the extending part of the light-reflecting layer is electrically connected to the substrate or the photoelectric conversion unit may be positioned in the imaging area, may be positioned in the optical black pixel area (OPB) at the outer circumference of the imaging area, or may be positioned in the peripheral area outside the imaging area. In the case where the area, in which the substrate or the photoelectric conversion unit is electrically connected to the light-reflecting layer-forming layer, is positioned in the imaging area or in the optical black pixel area (OPB), the area may be provided in each imaging element. Alternatively, the area may be provided for a plurality of imaging elements, or for all the imaging elements. Alternatively, the area may be for one imaging element, or a plurality of the areas may be provided for one imaging element. In the case where the area is positioned in the peripheral area, one or a plurality of the areas may be provided.

The wire grid polarizer does not have to be formed in the peripheral area or in an area between the imaging elements. The peripheral area or the area between the imaging elements (including an imaging element positioned in the optical black pixel area, and the same applies to the following) are preferably occupied by a second stacked structure (frame) including at least the light-reflecting layer and the light-absorbing layer (for example, including light-reflecting layer, insulating layer, and light-absorbing layer). In the case where the second stacked structure does not function as the wire grid polarizer, a line and space pattern may be provided like the wire grid polarizer. In other words, the pitch $P_0$ at which the wire grid has been formed may be sufficiently larger than the effective wavelength of incident electromagnetic waves.

A light-blocking layer can be formed in the area between the imaging elements, and the extending part of the light-reflecting layer can be in contact with the area of the light-blocking layer. The length of the extending part of the light-reflecting layer in contact with the area of the light-blocking layer can be the same length as a photoelectric conversion area that is an area in the imaging element for substantially carrying out the photoelectric conversion. Alternatively, the length of the extending part can be the same length as the photoelectric conversion area or can be the length equal to half of the length of the photoelectric conversion area. Such configurations can prevent color mixture from neighboring imaging elements. The area in which the light-reflecting layer-forming layer is in contact with the light-absorbing layer-forming layer is the area between the imaging elements, and can be one of the four corners of the imaging element. The light-blocking layer can also be formed in the peripheral area, and the extending part of the light-reflecting layer can be in contact with the area of the light blocking layer. The length of the extending part of the light-reflecting layer in contact with the area of the light-blocking layer can be an arbitrary length inherently.

In the imaging device, the method of manufacturing an imaging device, the imaging element, and the method of manufacturing an imaging element according to the embodiments of the present disclosure including preferable embodiments, the wire grid polarizer can include the light-reflecting layer, the insulating layer, and the light-absorbing layer that are stacked in this order from the photoelectric conversion unit side. In this case, the insulating layer can be formed on a whole top surface of the light-reflecting layer, and the light-absorbing layer can be formed on a whole top surface of the insulating layer. This enables the whole area of the light-absorbing layer and the light-reflecting layer to be electrically connected to the substrate or the photoelectric conversion unit, and it is possible to prevent discharge more certainly. Alternatively, the wire grid polarizer can include the light-reflecting layer and the light-absorbing layer that are stacked in this order from the photoelectric conversion unit side while the insulating layer is omitted. In this case, a base film can be formed between the photoelectric conversion unit and the light-reflecting layer. This enables roughness of the light-reflecting layer-forming layer and the light-reflecting layer to be improved.

In the imaging element, the imaging element constituting the imaging device, the imaging element obtained by the method of manufacturing an imaging element, the imaging element obtained by the method of manufacturing an imaging device according to embodiments of the present disclosure including the preferable embodiments described above (hereinafter, these imaging elements may be referred to as "imaging elements and(or) the like according to the embodiments of the present disclosure"), the direction in which the band-like light-reflecting layer extends is the same as a polarization orientation in which light is extinguished, and the repeating direction of the band-like light-reflecting layer is the same as a polarization orientation in which light penetrates. In other words, the light-reflecting layer has a function of a polarizer. Among light incident on the wire grid polarizer, the light-reflecting layer attenuates polarized waves (one of TE waves/S waves and TM waves/P waves) having an electric field component in a direction parallel to the direction in which the light-reflecting layer extends, and the light-reflecting layer transmits polarized waves (the other of TE waves/S waves and TM waves/P waves) having an electric field component in a direction perpendicular to the direction in which the light-reflecting layer extends (repeating direction of band-like light-reflecting layer). That is, the direction in which the light-reflecting layer extends is a light-absorbing axis of the wire grid polarizer, and the direction perpendicular to the direction in which the light-reflecting layer extends is a light transmission axis of the wire grid polarizer. For convenience, sometimes the direction in which the band-like light-reflecting layer (having the line and space pattern) extends may be referred to as a "first direction", and the repeating direction of the band-like light-reflecting layer (direction perpendicular to a direction in which the light-reflecting layer extends) may be referred to as a "second direction."

In the imaging element or the like according to an embodiment of the present disclosure, the length of the light-reflecting layer in the first direction can be the same length as the length of the photoelectric conversion area in the first direction, the same length as the length of the imaging element, or the integer multiple of the length of the imaging element in the first direction. The photoelectric conversion area is the area in which photoelectric conversion is substantially carried out in the imaging element.

With regard to the imaging elements or the like according to embodiments of the present disclosure, imaging elements having an angle of 0 degree between the first direction and a direction, in which a plurality of imaging elements are arranged, and imaging elements having an angle of 90 degrees between the first direction and the direction, in which a plurality of imaging elements are arranged, can be combined. Alternatively, imaging elements having an angle of 0 degree, imaging elements having an angle of 45 degrees, imaging elements having an angle of 90 degrees, and imaging elements having an angle of 135 degrees between the first direction and the direction, in which a plurality of imaging elements are arranged, can be combined, for example.

With regard to the imaging element or the like according to embodiments of the present disclosure, the wire grid polarizer can be disposed over an on-chip lens (OCL), or the on-chip lens (OCL) can be disposed over the wire grid polarizer. For convenience, sometimes the former imaging element is referred to as an "imaging element A according to an embodiment of the present disclosure," and the latter imaging element is referred to as an "imaging element B according to an embodiment of the present disclosure."

In the imaging element A according to the embodiment of the present disclosure, a planarizing layer and a base insulating layer can be formed in this order between the on-chip lens (positioned at lower side) and the wire grid polarizer (positioned at upper side) from the on-chip lens side. For example, the planarizing layer is made of transparent resin (for example, acrylic resin), and the base insulating layer is made of inorganic material such as a silicone oxide film that functions as a base of a process in a step for manufacturing the wire grid polarizer. In addition, in the imaging element A according to the embodiment of the present disclosure having the above-described preferable structure, a wavelength selection layer (specifically, for example, a known color filter layer) can be disposed below the on-chip lens.

On the other hand, in the imaging element B according to an embodiment of the present disclosure, a wavelength selection layer (specifically, for example, a known color filter layer) can be disposed between the wire grid polarizer (positioned at lower side) and the on-chip lens (positioned at upper side). By adopting such a configuration, it is possible to optimize each wire grid polarizer independently in a wavelength band of transmitted light in each wire grid polarizer, and it is also possible to achieve a lower reflectance ratio in all visible light areas. The planarizing layer is in between the wire grid polarizer and the wavelength selection layer, and the base insulating layer is formed below the wire grid polarizer. The base insulating layer is made of inorganic material such as a silicone oxide film that functions as a base of a process in a step for manufacturing the wire grid polarizer.

The example of the color filter layer includes a filter layer that transmits a specific wavelength such as red, green, blue, cyan, magenta, or yellow. The color filter layer can include an organic color filter layer using an organic compound such as pigment or dye, or can include a wavelength selector using photonic crystal or plasmon (color filter later having a conductor grid structure in which a conductor's thin film has a grid-like hole structure. For example, JP 2008-177191A), or a thin film made of an inorganic material such as amorphous silicon.

In addition, with regard to the imaging element or the like according to the embodiment of the present disclosure, a light-blocking layer is in an area positioned between adjacent imaging elements. The light-blocking layer is made of chromium (Cr), copper (Cu), aluminum (Al), or tungsten (W), for example. This enables leakage of light into adjacent imaging elements (polarization crosstalk) to be prevented more effectively. In addition, various kinds of wiring (wiring layer) made of aluminum (Al), copper (Cu), or the like is in the photoelectric conversion unit to drive the imaging element.

The example of the substrate includes a compound semiconductor substrate such as an InGaAs substrate and a silicon semiconductor substrate.

In the imaging element A according to the embodiment of the present disclosure, the photoelectric conversion unit includes the photoelectric conversion area, the on-chip lens, the planarizing layer, the base insulating layer, the light-blocking layer, the color filter layer, the wiring (wiring layer), and various interlayer insulating layers. In the photoelectric conversion area, current is generated on the basis of incident light. In the imaging element B according to the embodiment of the present disclosure, the photoelectric conversion unit includes the photoelectric conversion area, the base insulating layer, the light-blocking layer, the wiring (wiring layer), and various interlayer insulating layers. In the photoelectric conversion area, current is generated on the basis of incident light. For example, a part of the photoelectric conversion unit that is electrically connected to the extending part of the light-reflecting layer and the light-reflecting layer-forming layer is the light-blocking layer or the wiring (wiring layer). For example, in a part of the substrate that is electrically connected to the extending part of the light-reflecting layer and the light-reflecting layer-forming layer, a concentrated impurity area, a metal later, an alloy layer, the wiring layer or the like may be formed.

In the imaging element or the like of the embodiments of the present disclosure, the light-reflecting layer may be made of metal material, alloy material, or semiconductor material, and the light-absorbing layer may be made of metal material, alloy material, or semiconductor material.

Examples of the inorganic material constituting the light-reflecting layer (light-reflecting layer-forming layer) include metal materials such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), or tellurium (Te), alloy material including such metal, and semiconductor material. Examples of material constituting the base film (barrier metal layer) between the photoelectric conversion unit and the light-reflecting layer include Ti, TiN, and a stacked structure of Ti/TiN.

Examples of material constituting the light-absorbing layer (light-absorbing layer-forming layer) include metal material, alloy material, and semiconductor material whose extinction coefficients k are not zero; in other words, they have a light-absorbing function. Specifically, the examples include metal material such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), or tin (Sn), alloy material including such metal, and semiconductor material. In addition, the examples further include silicide-based material such as $FeSi_2$ (specifically, $\beta$-$FeSi_2$), $MgSi_2$, $NiSi_2$, $BaSi_2$, $CrSi_2$, or $CoSi_2$. Specifically, usage of aluminum, aluminum alloy, or semiconductor material including $\beta$-$FeSi_2$, germanium, or tellurium as the material constituting the light-absorbing layer enables high contrast (high extinction ratio) in the visible light area. In order to attach a polarization characteristic to a wavelength band other than visible light such as an infrared area, it is preferable to use silver (Ag), copper (Cu), gold (Au), or the like as the material constituting the light-absorbing layer (light-absorbing layer-forming layer). This is because resonant wavelength of such metal is near the infrared area.

The light-reflecting layer-forming layer and the light-absorbing layer-forming layer can be formed on the basis of a known method such as various chemical vapor deposition methods (CVD methods), coating methods, various physical vapor deposition methods (PVD methods) including sputtering and vacuum deposition methods, the sol-gel method, plating methods, the MOCVD method, or the MBE method. Examples of a method of patterning the light-reflecting layer-forming layer or the light-absorbing layer-forming layer include a combination of a lithography technology and an etching technology (for example, physical etching technology or an anisotropic dry etching technology using carbon tetrafluoride gas, sulfur hexafluoride gas, trifluoromethane gas, or xenon difluoride gas, for example), a so-called liftoff technology, and a so-called self-aligned double patterning technology using a side wall as a mask. Examples of the lithography technology include a photolithography technology (lithography technology using a light source such as a g ray and an i ray of a high-pressure mercury vapor lamp, KrF excimer laser, ArF excimer laser, or EUV, and an immersion lithography technology, an electron lithography, and an X-ray lithography thereof). Alternatively, the light-reflecting layer or the light-absorbing layer can be formed on the basis of a nanoimprint method or a microfabrication technology using an ultrashort pulse laser such as a femtosecond laser.

Examples of the material constituting the insulating layer (insulating layer-forming layer) or the interlayer insulating layer include insulating material that is transparent to incident light and that does not have a light-absorbing characteristic. Specifically, the examples include SiOx-based material (material constituting silicon-based oxide film) such as $SiO_2$, non-doped silicate glass (NSG), borophosphosilicate glass (BPSG), PSG, BSG, PbSG, AsSG, SbSG, or spin-on glass (SOG), SiN, SiON, SiOC, SiOF, SiCN, low-dielectric constant insulating material (for example, fluorocarbon, cycloperfluorocarbon polymer, benzocyclobutene, cyclic fluororesin, polytetrafluoroethylene, amorphous tetrafluoroethylene, polyaryl ether, aryl ether fluoride, polyimide fluoride, organic SOG, parylene, fluorinated fullerene, or amorphous carbon), a polyimide-based resin, a fluorine-based resin, Silk (trademark of The Dow Chemical Co.; a coating-type low-dielectric constant interlayer insulating film material), and Flare (trademark of Honeywell Electronic Materials Co.; a polyaryl ether (PAE)-based material). These materials can be used solely or appropriately in combinations. The insulating layer-forming layer can be formed based on various CVD methods, a coating method, various PVD methods including a sputtering method and a vacuum evaporation method, various printing methods such as a screen printing method, and a known method such as a sol-gel method. The insulating layer functions as a base layer of the light-absorbing layer and is formed for the purpose of adjusting the phase of polarized light reflected from the light-absorbing layer and polarized light having passed through the light-absorbing layer and reflected from the light-reflecting layer and decreasing the reflectance by an interference effect. Thus, the insulating layer preferably has such a thickness that the phase of light after one round trip is shifted by a half wavelength. Since the light-absorbing layer has a light-absorbing effect, the reflected light is absorbed therein. Therefore, even when the thickness of the insulating layer is not optimized as described above, it is possible to attain an improvement of the extinction ratio. Therefore, the thickness of the insulating layer may be determined based on a balance between practically desired polarization characteristics and actual manufacturing steps. For example, the thickness of the insulating layer may be in the range of $1\times10^{-9}$ m to $1\times10^{-7}$ m, and more preferably, in the range of $1\times10^{-8}$ m to $8\times10^{-8}$ m. Moreover, the refractive index of the insulating layer may be a value larger than 1.0. Preferably, the refractive index may be set to 2.5 or lower, but the refractive index is not limited thereto In the imaging device according to the embodiments of the present disclosure, one imaging element unit (one pixel) is made up of a plurality of imaging elements (subpixels). Each subpixel includes one imaging element. The relation between pixels and subpixels will be described later.

In the imaging element or the like according to an embodiment of the present disclosure, light is incident from the light-absorbing layer. The wire grid polarizer attenuates a polarized wave (one of TE wave/S wave and TM wave/P wave) having an electric field component parallel to the first direction and transmits a polarized wave (the other of TE wave/S wave and TM wave/P wave) having an electric field component parallel to the second direction by using four selective light-absorbing actions on the polarized wave based on transmission, reflection, interference, and optical anisotropy of light. That is, one polarized wave (for example, TE wave) is attenuated by a selective light-absorbing action on the polarized wave based on the optical anisotropy of the light-absorbing layer. The band-like light-reflecting layer functions as a polarizer and reflects one of polarized waves (for example, TE wave) that has passed through the light-absorbing layer and the insulating layer. In this case, when the insulating layer is configured such that the phase of one of the polarized waves (for example, TE wave) that has passed through the light-absorbing layer and reflected from the light-reflecting layer is shifted by a half wavelength, one of the polarized waves (for example, TE wave) reflected from the light-reflecting layer is cancelled and attenuated by interference with one of polarized waves (for example, TE wave) reflected from the light-absorbing layer. In this way, it is possible to selectively attenuate one polarized wave (for example, TE wave). In this case, as described above, even when the thickness of the insulating layer is not optimized, it is possible to realize an improvement in the contrast. Therefore, as described above, the thickness of the insulating layer may be determined on the basis of a balance between practically desired polarization characteristics and actual manufacturing steps.

When the metal material or alloy material (hereinafter sometimes referred to as "metal material or the like") constituting the wire grid polarizer meets outside air, corrosion resistance of the metal material or the like deteriorates due to attachment of moisture or organic materials from the outside air. Thus, the long-term reliability of the imaging element may deteriorate. In particular, when moisture adheres on a stacked structure of a metal material or the like, an insulating material, and a metal material or the like, since $CO_2$ and $O_2$ are dissolved in the moisture, it acts as an electrolytic solution. Thus, a local cell may be formed between two kinds of metals. When such a phenomenon occurs, a reductive reaction such as generation of hydrogen progresses on a cathode (positive electrode) side, and an oxidative reaction progresses on an anode (negative electrode) side, whereby an abnormal precipitation of the metal material or the like or a change in shape of the wire grid polarizer occurs. As a result, the expected performance of the wire grid polarizer and the imaging element may be degraded. For example, when aluminum (Al) is used for the light-reflecting layer, an abnormal precipitation of aluminum as shown by the following reaction formula may occur.

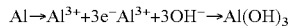

Therefore, it is preferable that a protective film is formed on the wire grid polarizer in the imaging element or the like according to the embodiments of the present disclosure. The thickness of the protective film may be in a range such that polarization characteristics are not affected. Moreover, since the reflectance to incident light is changed depending on an optical thickness (refractive index×protective film thickness) of the protective film, the material and thickness of the protective film may be selected in view of the above. The thickness of the protective film may be 15 nm or smaller. Alternatively, the thickness of the protective film may be ¼ or less of the distance between the stacked structures. As the material constituting the protective film, a material of which the refractive index is 2 or smaller and the extinction coefficient is close to zero is preferred. Examples of the material include insulating material, such as $SiO_2$ including TEOS-$SiO_2$, SiON, SiN, SiC, SiOC, or SiCN and metal oxide such as aluminum oxide ($AlO_X$), hafnium oxide ($HfO_X$), zirconium oxide ($ZrO_X$), or tantalum oxide ($TaO_X$). Alternatively, perfluorodecyl trichlorosilane or octadecyl trichlorosilane may be used. By providing the protective film, it is possible to improve moisture resistance of the wire grid polarizer and to improve the reliability. Although the protective film can be formed by various CVD methods, a coating method, various PVD methods including a sputtering method and a vacuum evaporation method, and a known process such as a sol-gel method, it is preferable to employ a so-called Atomic Layer Deposition (ALD) method or a high-density plasma chemical vapor deposition (HDP-CVD) method. By employing the ALD method or the HDP-CVD method, it is possible to form a thin protective film conformally on the wire grid polarizer. Although the protective film may be formed on the entire surface of the wire grid polarizer, it is also possible that the protective film is formed only on the side surface of the wire grid polarizer but is not formed on a base insulating layer positioned between wire grid polarizers. By forming the protective film so as to cover the side surface which is an exposed portion of the metal material or the like constituting the wire grid polarizer, it is possible to block moisture and an organic material in the air and to reliably suppress the occurrence of corrosion of the metal material or the like constituting the wire grid polarizer and the occurrence of a problem of abnormal precipitation. Moreover, it is possible to achieve an improvement of long-term reliability of the imaging element and to provide an imaging element having an on-chip wire grid polarizer having higher reliability.

According to the embodiments of the present disclosure, each imaging element constituting the imaging device may have a wire grid polarizer, or a part of the imaging elements may have the wire grid polarizer. The imaging element unit including a plurality of imaging elements may have a Bayer arrangement, and one imaging element unit (one pixel) may be made up of four imaging elements. The arrangement of the imaging element units is not limited to the Bayer arrangement, and examples of the arrangement include an interline arrangement, a G-striped RB-checkered arrangement, a G-striped and RB-complete-checkered arrangement, a checkered complementary-color arrangement, a stripe arrangement, an oblique-stripe arrangement, a primary-color color-difference arrangement, a field color-difference sequence arrangement, a frame color-difference sequence arrangement, a MOS arrangement, a modified MOS arrangement, a frame interleaved arrangement, and a field interleaved arrangement. For example, in the case of the Bayer arrangement, each of red, green, and blue color filter layers is disposed in each of three subpixel areas in 2×2 subpixel areas. A color filter layer is not disposed in the remaining one subpixel area in which a green color filter layer ought to be disposed in general, and a wire grid polarizer is disposed in the remaining one subpixel area. Alternatively, in the case of the Bayer arrangement, each of red, green, and blue color filter layers is disposed in each of three subpixel areas in 2×2 subpixel areas, and a green color filter layer and a wire grid polarizer are disposed in the remaining one subpixel area. Sometimes the filer is not necessary in the case where color separation or spectroscopy is not intended, or in the case of an imaging element having sensitivity to a specific wavelength. In the subpixel area in which the color filter layer is not disposed, a transparent resin layer may be disposed instead of the color filter layer in order to secure flatness between this subpixel area and subpixel areas in which color filter layers are disposed. That is, the imaging element may constitute a combination of the red imaging element having sensitivity to red, the green imaging element having sensitivity to green, and the blue imaging element having sensitivity to blue. In addition, the imaging element may constitute a combination of infrared imaging elements having sensitivity to infrared, may be an imaging device that obtains a monochrome image, or may be an imaging device that obtains a combination of a monochrome image and an infrared image.

The imaging element or the like according to the embodiments of the present disclosure may be a CCD, a CMOS image sensor, a contact image sensor (CIS), or a charge modulation device (CMD) type signal amplification image sensor. Moreover, the imaging element may be a front-illuminated imaging element or a back-illuminated imaging element. By using the imaging device, a digital still camera, a video camera, a camcorder, a security camera, a car-mounted camera, a smartphone camera, a game user interface camera, or a biometric authentication camera can be formed, for example. In addition to normal image capturing, the imaging device can acquire polarization information at the same time. In addition, the imaging device may capture a stereoscopic image.

First Embodiment

Figure 2:
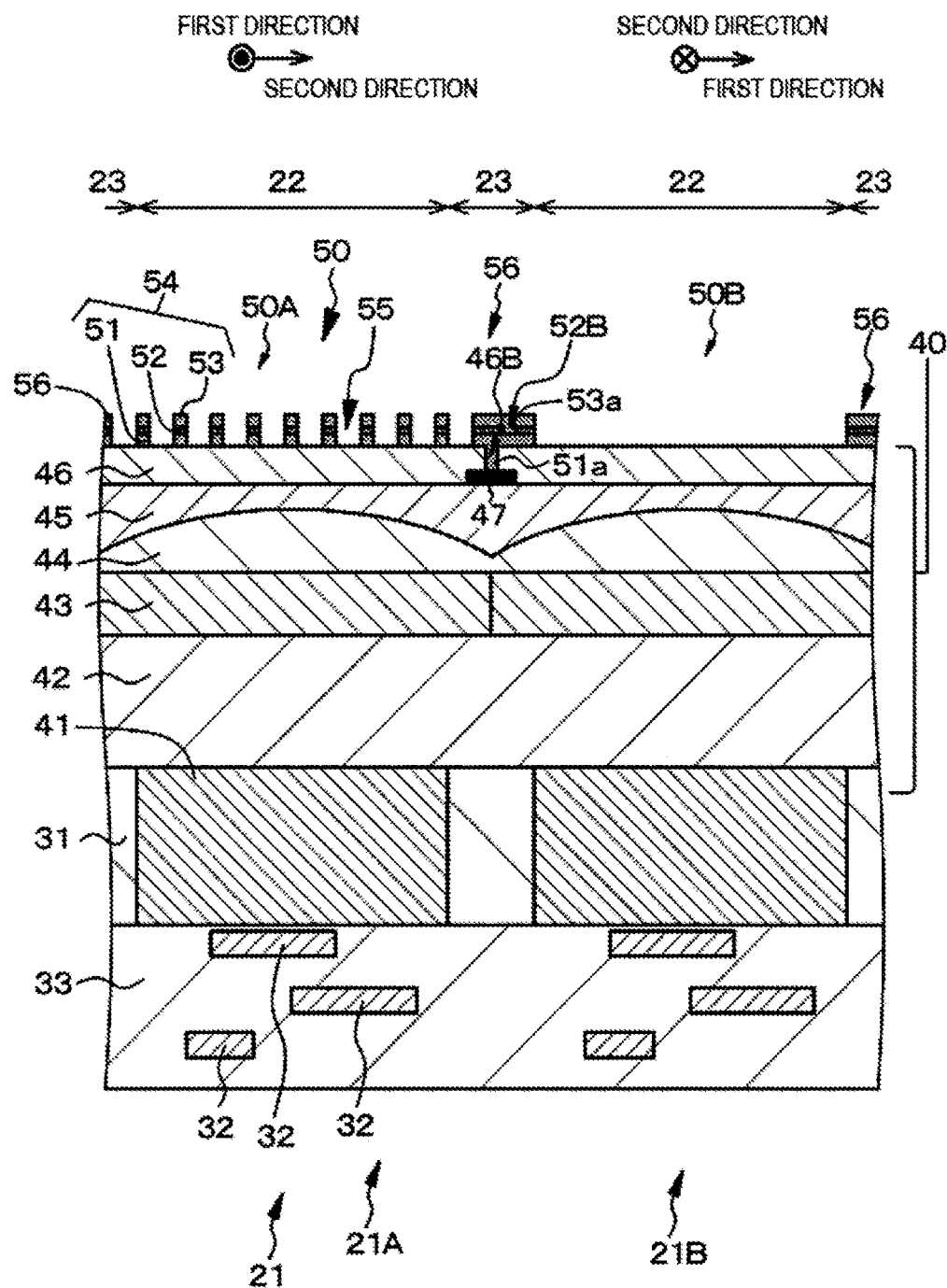
FIG. 2 is a schematic partial end view of imaging elements in an imaging device according to the first embodiment.
Figure 3:
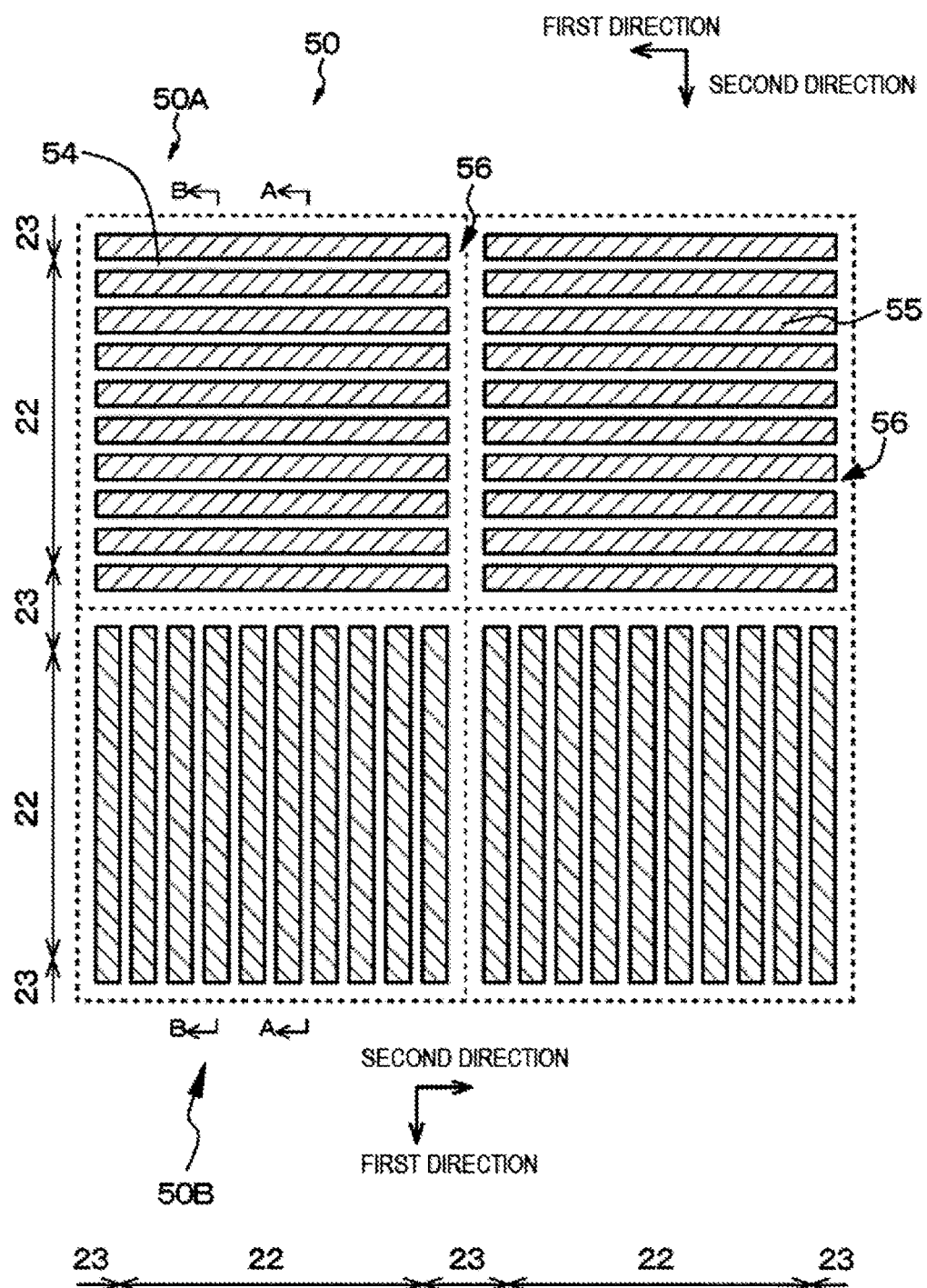
FIG. 3 is a schematic partial plan view of imaging elements in an imaging device according to the first embodiment.
Figure 4:
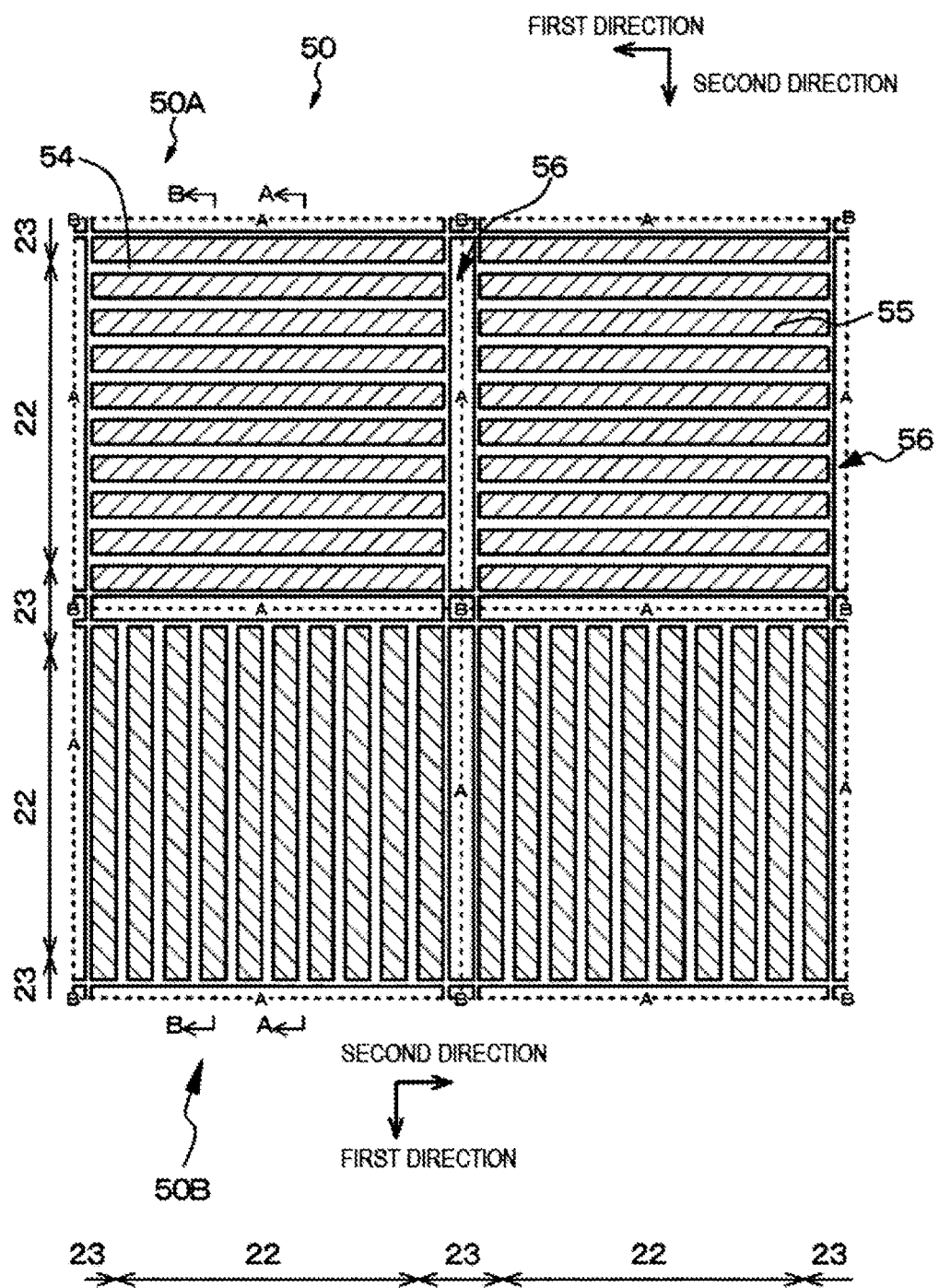
FIG. 4 is a schematic partial plan view of imaging elements in an imaging device according to the first embodiment.
Figure 5:
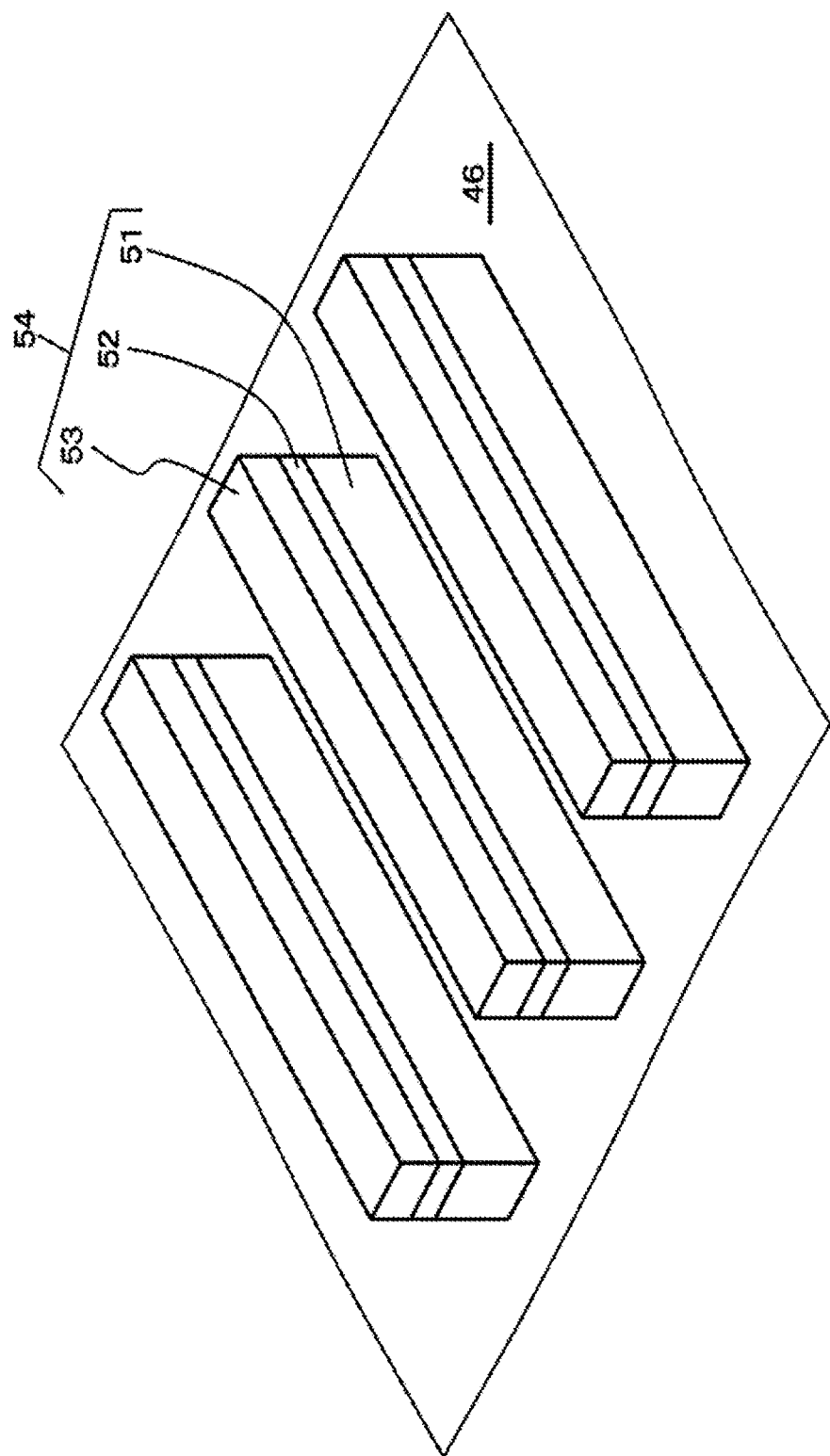
FIG. 5 is a schematic perspective view of a wire grid polarizer constituting an imaging element in an imaging device according to the first embodiment.
Figure 6:
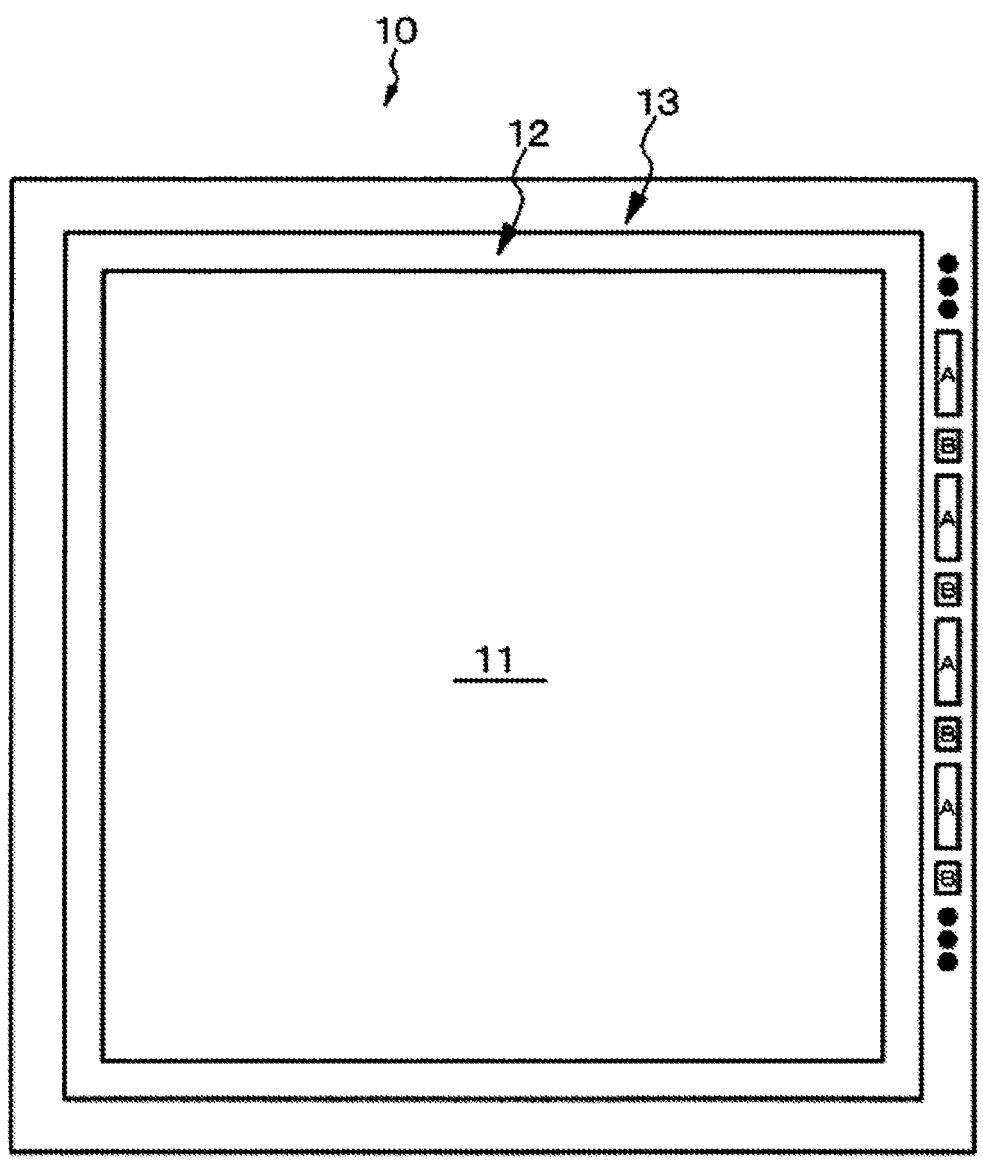
FIG. 6 is a schematic plan view of an imaging device illustrating an imaging area and the like in the imaging device according to the first embodiment.

The first embodiment relates to an imaging element, a method of manufacturing the imaging element, an imaging device, and a method of manufacturing the imaging device according to an embodiment of the present disclosure. More specifically, the first embodiment relates to the imaging element A according to the embodiment of the present disclosure. In the first embodiment, the wire grid polarizer is disposed above the on-chip lens (OCL). The imaging device includes the back-illuminated imaging element. FIG. 1 and FIG. 2 each illustrate a schematic partial end view of the imaging elements constituting the imaging device according to the first embodiment. FIG. 3 and FIG. 4 each illustrate a schematic partial plan view of the imaging elements in the imaging device according to the first embodiment. FIG. 5 illustrates a schematic perspective view of the wire grid polarizer constituting the imaging element in the imaging device according to the first embodiment. FIG. 6 illustrates a schematic plan view of the imaging device showing the imaging area and the like in the imaging device according to the first embodiment. FIG. 1 and FIG. 2 each illustrate two imaging elements, and FIG. 3 and FIG. 4 each illustrate four imaging elements. In addition, FIG. 1 is the schematic partial end view along arrows A-A in FIG. 3 and FIG. 4, and FIG. 2 is the schematic partial end view along arrows B-B in FIG. 3 and FIG. 4. FIG. 1 and FIG. 2 illustrate the schematic partial end view of the imaging elements in the direction in which the band-like light-reflecting layer extends in the wire grid polarizers, and the schematic partial end view of the imaging elements in the repeating direction of the band-like light-reflecting layer (direction perpendicular to the direction in which the band-like light-reflecting layer extends). In FIG. 3 and FIG. 4, boundaries between imaging elements are illustrated with dotted lines, and gaps (spaces) between the stacked structures are hatched.

An imaging element 21 in the first embodiment includes:
a photoelectric conversion unit 40 on a substrate 31; and
a wire grid polarizer 50 which is arranged at a light-incident side of the photoelectric conversion unit 40 and in which a plurality of stacked structures 54 are separately placed side by side, each of the stacked structures 54 including at least a band-like light-reflecting layer 51 and a band-like light-absorbing layer 53.

The light-reflecting layer 51 is made of a first electrical conducting material (specifically, aluminum (Al)).

The light-absorbing layer 53 is made of a second electrical conducting material (specifically, tungsten (W)).

An extending part 51a of the light-reflecting layer 51 is electrically connected to the substrate 31 or the photoelectric conversion unit 40 photoelectric conversion unit 40 in first embodiment. More specifically, the extending part 51a of the light-reflecting layer 51 is electrically connected to the light-blocking layer 47. In at least one example, the light-blocking layer 47 is grounded.

The imaging device according to the first embodiment includes a plurality of the imaging elements 21 according to the first embodiment in an imaging area 11. For example, the imaging device includes two or more kinds of wire grid polarizers 50 having polarization directions different from each other, for example. An extending part 51a of the light-reflecting layer 51 is electrically connected to the substrate 31 or the photoelectric conversion unit 40 (photoelectric conversion unit 40 in first embodiment. More specifically, light-blocking layer 47). A transmission axis of a wire grid polarizer 50A in an imaging element 21A is perpendicular to a transmission axis of a wire grid polarizer 50B in an adjacent imaging element 21B. By using the imaging device according to the first embodiment, a digital still camera, a video camera, a camcorder, a security camera, a car-mounted camera (car camera), a smartphone camera, a game user interface camera, or a biometric authentication camera can be formed, for example. In the first embodiment, an on-chip lens 44 is disposed above a photoelectric conversion area 41, and the wire grid polarizer 50 is disposed above the on-chip lens 44. A reference sign 22 indicates an area occupied by the imaging element 21, and a reference sign 23 indicates an area between the imaging elements 21.

In the first embodiment, an area in which the photoelectric conversion unit 40 is electrically connected to a light-reflecting layer-forming layer 51A is positioned in the imaging area 11. In other words, the area in which the extending part 51a of the light-reflecting layer 51 is electrically connected to the photoelectric conversion unit 40 is positioned in the imaging area 11. The area in which the photoelectric conversion unit 40 is electrically connected to a light-reflecting layer-forming layer 51A or the extending part 51a of the light-reflecting layer 51 may be provided in each imaging element, or may be provided for one of a plurality of imaging elements, or for one of all the imaging elements.

Specifically, in the imaging element 21 according to the first embodiment, the photoelectric conversion area 41, a first planarizing film 42, a wavelength selection layer (color filter layer 43), the on-chip lens 44, a planarizing layer (referred to as second planarizing film 45), a base insulating layer 46, and the wire grid polarizer 50 are stacked in this order. The photoelectric conversion area 41 is in the substrate 31 including a silicon semiconductor substrate. The first planarizing film 42 and the base insulating layer 46 are made of $SiO_2$, and the planarizing layer (second planarizing film 45) is made of acrylic resin. The photoelectric conversion area 41 includes the CCD, the CMOS image sensor, or the like. For example, the light-blocking layer (so-called black matrix layer) 47 made of tungsten (W) or the like is positioned above an area between the adjacent on-chip lenses 44 (more specifically, is positioned in base insulating layer 46 above a boundary between the on-chip lenses 44). The light-blocking layer 47 is preferably positioned in the base insulating layer 46 that is insulating material, so as to avoid mutual interference of free electrons in the light-blocking layer 47 and the light-reflecting layer 51 made of metal material, for example.

In the imaging element according to the first embodiment, the photoelectric conversion unit 40 includes the photoelectric conversion area 41, the first planarizing film 42, the wavelength selection layer (color filter layer 43), the on-chip lens 44, the planarizing layer (second planarizing film 45), the base insulating layer 46, and the light-blocking layer 47.

In the imaging device according to the first embodiment, the light-reflecting layer 51 and the light-absorbing layer 53 (specifically, light-reflecting layer 51, insulating layer 52, and light-absorbing layer 53 in first embodiment) are shared by the imaging elements. That is, the area 23 between the imaging elements, an optical black pixel area (OPB) 12, and a peripheral area 13 are occupied by a second stacked structure (frame) 26 including the light-reflecting layer 51, the insulating layer 52, and the light-absorbing layer 53. Gaps (spaces) 55 are in between the stacked structures 54. In other words, the stacked structures 54 have the line and space pattern.

The light-blocking layer 47 is in the area 23 between the imaging elements, and the extending part 51a of the light-reflecting layer 51 is in contact with the area of the light-blocking layer 47. For convenience, in FIG. 4, a part in which the extending part 51a of the light-reflecting layer 51 is in contact with the area if the light-blocking layer 47 is boxed and denoted with a reference sign "A". The length of the extending part 51a of the light-reflecting layer 51 in contact with the area of the light-blocking layer 47 is the same as the length of the photoelectric conversion area 41. Such configurations can prevent color mixture from neighboring imaging elements. The area in which the light-reflecting layer 51 (light-reflecting layer-forming layer 51A) is in contact with the light-absorbing layer 53 (light-absorbing layer-forming layer 53A) is the area 23 between the imaging elements, and is at least one (specifically, four) of the four corners of the imaging element. For convenience, in FIG. 4, the area in which the light-reflecting layer 51 (light-reflecting layer-forming layer 51A) is in contact with the light-absorbing layer 53 (light-absorbing layer-forming layer 53A) is boxed and denoted with a reference sign "B". To simplify the drawings, positions of the extending part 51a (light-reflecting layer extending part 51A) of the light-reflecting layer 51 and the extending part 53a of the light-absorbing layer-forming layer 53A in FIGS. 1 and 2 or FIGS. 8 and 9 are discrepant from positions of the extending parts 51a and 53a in FIG. 4. In some cases, the part A in which the extending part 51a of the light-reflecting layer 51 is in contact with the area of the light-blocking layer 47 may surround the imaging element, and the area B in which the light-reflecting layer 51 (light-reflecting layer-forming layer 51A) is in contact with the light-absorbing layer 53 (light-absorbing layer-forming layer 53A) may surround the imaging element.

Figure 10:
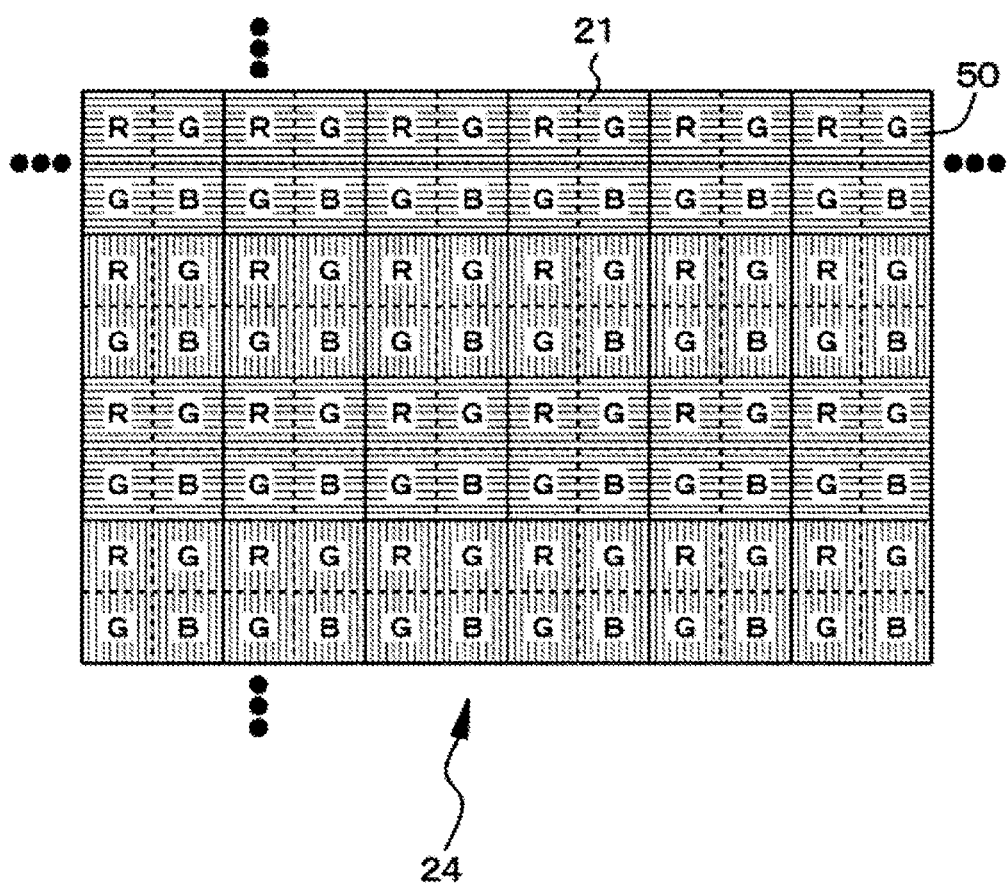
FIG. 10 is a conceptual diagram of imaging element units having the Bayer arrangement in an imaging device according to the first embodiment.

In the first embodiment, the imaging element unit (pixel) 24 made of a plurality of imaging elements has the Bayer arrangement, and constitutes four imaging elements. FIG. 10 illustrates a conceptual diagram of such imaging element units 24 having the Bayer arrangement. The one imaging element unit (one pixel) 24 is made of one subpixel that receives red light (red imaging element R in FIG. 10), one subpixel that receives blue light (blue imaging element B in FIG. 10), and two subpixels that receive green light (green imaging elements G in FIG. 10). The imaging element units 24 are arranged in a two-dimensional matrix form in a row direction and a column direction. The first directions of all the wire grid polarizers 50 in one imaging element unit are the same. In addition, the first directions of the wire grid polarizers 50 in imaging element units arranged in the row direction are the same. On the other hand, an imaging element unit in which the first direction of the wire grid polarizers 50 is parallel to the row direction and an imaging element unit in which the first direction of the wire grid polarizers 50 is parallel to the column direction are arranged alternately in the column direction. In FIG. 10 and FIGS. 11 to 24 to be described later, wire grid polarizers are hatched.

As described above, in the wire grid polarizer 50, the light-reflecting layer 51, the insulating layer 52, and the light-absorbing layer 53 are stacked in this order from the photoelectric conversion unit 40 side. In other words, the stacked structure 54 includes the light-reflecting layer 51, the insulating layer 52, and the light-absorbing layer 53. In addition, the insulating layer 52 is on a whole top surface of the light-reflecting layer 51, and the light-absorbing layer 53 is on a whole top surface of the insulating layer 52. Specifically, the light-reflecting layer 51 is made of aluminum (Al) having the thickness of 150 nm, the insulating layer 52 is made of $SiO_2$ having the thickness of 25 nm or 50 nm, and the light-absorbing layer 53 is made of tungsten (W) having the thickness of 25 nm. Although the base film made of Ti, TiN, or a stacked structure of Ti/TiN is in between the photoelectric conversion unit 40 and the light-reflecting layer 51, the base film is omitted in the drawings. The direction in which the band-like light-reflecting layer 51 extends (first direction) is identical to the polarization orientation in which light is extinguished, and the repeating direction of the band-like light-reflecting layer 51 (second direction perpendicular to first direction) is identical to the polarization orientation in which light penetrates. In other words, the light-reflecting layer 51 has a function of a polarizer. Among light incident on the wire grid polarizer 50, the light-reflecting layer 51 attenuates polarized waves having an electric field component in a direction parallel to the direction in which the light-reflecting layer extends (first direction), and the light-reflecting layer 51 transmits polarized waves having an electric field component in a direction perpendicular to the direction in which the light-reflecting layer 51 extends (second direction). The first direction is the light-absorbing axis of the wire grid polarizer 50, and the second direction is the light transmission axis of the wire grid polarizer 50.

In the first embodiment, the length of the stacked structure 54 in the first direction is the same as the length in the first direction of the photoelectric conversion area 41 in the first direction. In the example in the drawings, imaging elements having an angle of 0 degree and imaging elements having an angle of 90 degrees between the first direction (direction in which band-like light-reflecting layer 51 extends) and a direction in which a plurality of imaging elements are arranged are combined. However, imaging elements having an angle of 0 degree, imaging elements having an angle of 45 degrees, imaging elements having an angle of 90 degrees, and imaging elements having an angle of 135 degrees between the first direction (direction in which band-like light-reflecting layer 51 extends) and the direction in which a plurality of imaging elements are arranged may be combined.

Hereinafter, with reference to FIG. 7A, FIG. 7B, FIG. 7C, and FIG. 7D that are each a schematic partial end view of a substrate and the like, the methods of manufacturing an imaging element and an imaging device according to the first embodiment will be described.

<Step 100>

First, on the basis of a known method, various kinds of driving circuits and wiring (wiring layer) to drive the imaging element are formed on one surface of the substrate 31 made of a silicon semiconductor substrate. Reference signs 32 indicate the driving circuit and wiring (wiring layer) as a whole. Next, the other surface of the substrate 31 is ground and/or thinned to obtain the substrate 31 having a desired thickness. A reference sign 33 indicates an interlayer insulating film on the one surface of the substrate 31.

<Step 110>

Subsequently, the photoelectric conversion unit 40 is formed on the substrate 31 on the basis of a known method. In other words, according to the known method, the photoelectric conversion area 41 is formed on the other surface of the substrate 31, and a connection part (not illustrated) for electrically connecting the photoelectric conversion area 41 and the driving circuit and wiring (wiring layer) 32 is formed. Next, the first planarizing film 42, the wavelength selection layer (color filter layer 43), the on-chip lens 44, the planarizing layer (second planarizing film 45), the light-blocking layer 47, and the base insulating layer 46 are formed on the photoelectric conversion area 41 according to known methods. Thereby, the photoelectric conversion unit 40 is prepared. As described above, the photoelectric conversion unit 40 includes the photoelectric conversion area 41, the first planarizing film 42, the wavelength selection layer (color filter layer 43), the on-chip lens 44, the planarizing layer (second planarizing film 45), the light-blocking layer 47, and the base insulating layer 46. The base insulating layer 46 has a first opening 46B above the light-blocking layer 47.

<Step 120>

Figure 7A:
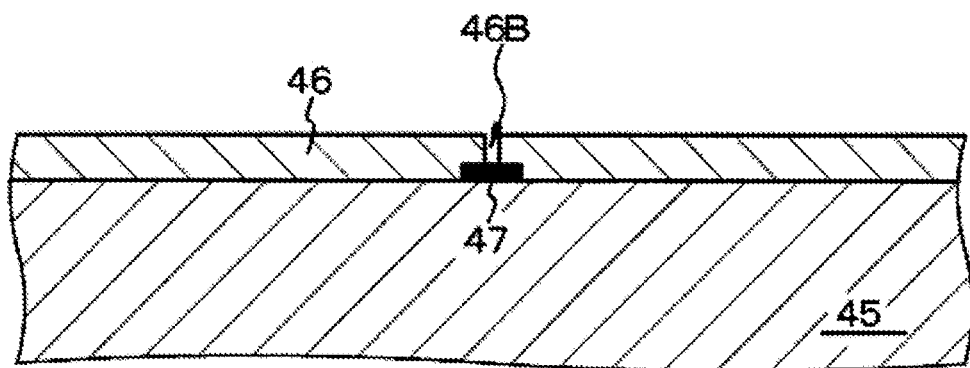
FIG. 7A is a schematic partial end view of a substrate and the like that illustrates a method of manufacturing an imaging element and an imaging device according to the first embodiment.
Figure 7B:
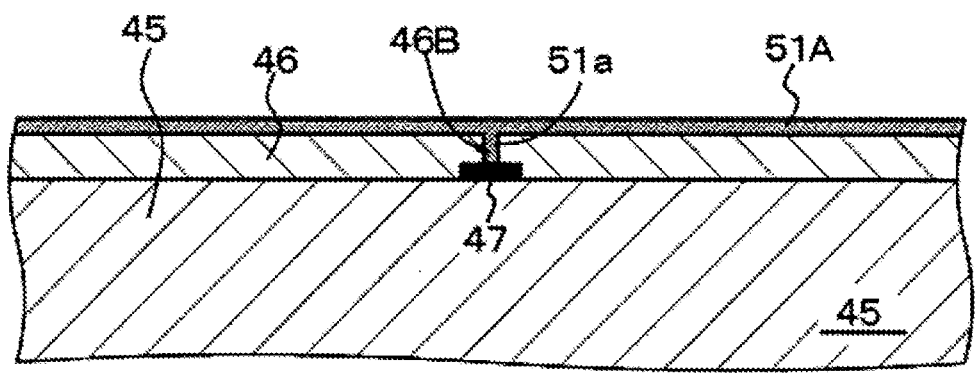
FIG. 7B is a schematic partial end view of a substrate and the like that illustrates a method of manufacturing an imaging element and an imaging device according to the first embodiment.
Figure 7C:
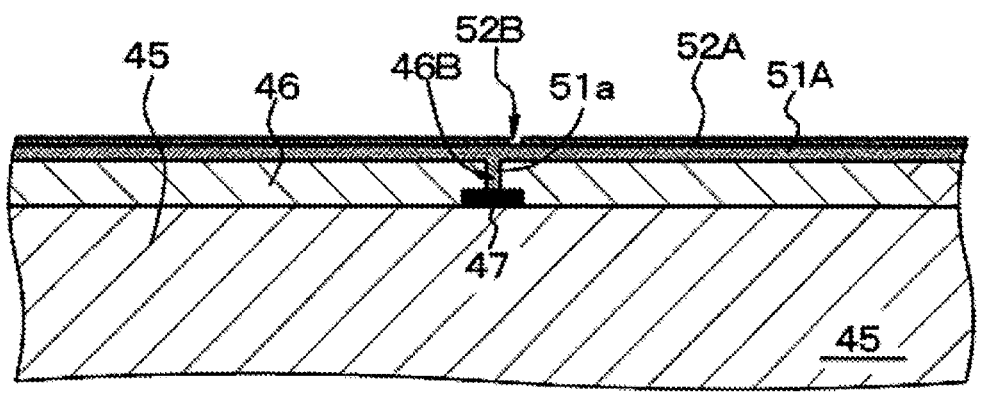
FIG. 7C is a schematic partial end view of a substrate and the like that illustrates a method of manufacturing an imaging element and an imaging device according to the first embodiment.
Figure 7D:
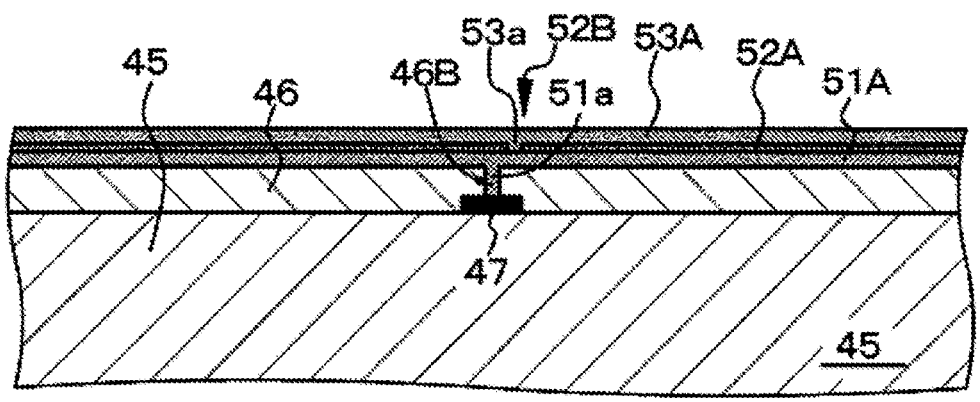
FIG. 7D is a schematic partial end view of a substrate and the like that illustrates a method of manufacturing an imaging element and an imaging device according to the first embodiment.

Next, the base film (not illustrated) made of Ti, TiN, or the stacked structure of Ti/TiN, and the light-reflecting layer-forming layer 51 made of the first electrical conducting material (specifically, aluminum) are formed above the photoelectric conversion unit 40 (specifically, above base insulating layer 46) on the basis of the vacuum evaporation method (see FIG. 7A and FIG. 7B). The light-reflecting layer-forming layer 51A extends to the top surface of the light-blocking layer 47 through the first opening 46B. In other words, the light-reflecting layer-forming layer 51A made of the first electrical conducting material is electrically connected to the substrate 31 or the photoelectric conversion unit 40 (specifically, light-blocking layer 47 in first embodiment). This means that the light-reflecting layer-forming layer 51A which is made of the first electrical conducting material and which is electrically connected to the substrate 31 or the photoelectric conversion unit 40 is formed on the photoelectric conversion unit 40. A reference sign 51a indicates a part of the light-reflecting layer-forming layer 51A connected to the light-blocking layer 47.

<Step 130>

Next, on or above the light-reflecting layer-forming layer 51A, the light-absorbing layer-forming layer 53A which is made of the second electrical conducting material and at least a part of which is in contact with the light-reflecting layer-forming layer 51A is formed. Specifically, an insulating layer-forming layer 52A made of $SiO_2$ is formed on the light-reflecting layer-forming layer 51A on the basis of the CVD method. Subsequently, on the basis of the photolithography technology and the etching technology, a second opening 52B is formed in a part of the insulating-layer forming layer 52A positioned above a desired area in the light-reflecting layer-forming layer 51A where the stacked structure 54 is to be formed. Thereby, the structure illustrated in FIG. 7C can be obtained. Subsequently, the light-absorbing layer-forming layer 53A made of tungsten (W) is formed on the insulating-layer forming layer 52A including inside of the second opening 52B, according to the sputtering method. Thereby, the structure illustrated in FIG. 7D can be obtained. The light-reflecting layer-forming layer 51A and the light-absorbing layer-forming layer 53A are connected via the extending part 53a of the light-absorbing layer-forming layer 53A extending through the second opening 52B. In this step, the light-absorbing layer-forming layer 53A is formed in a state in which potential of the light-reflecting layer-forming layer 51A is set to a predetermined potential via the substrate 31 or the photoelectric conversion unit 40 (specifically, in a state in which light-reflecting layer-forming layer 51A is grounded via light-blocking layer 47 in the first embodiment).

<Step 140>

Subsequently, the light-absorbing layer-forming layer 53A, the insulating-layer forming layer 52A, the light-reflecting layer-forming layer 51A, and the base film are patterned on the basis of the lithography technology and the dry etching technology to obtain the wire grid polarizer 50 in which the plurality of stacked structures 54 are separately placed side by side, each of the stacked structures 54 including the band-like light-reflecting layer, insulating layer 52, and light-absorbing layer 53. In this step, the light-absorbing layer-forming layer 53A, the insulating layer-forming layer 52A, and the light-reflecting layer-forming layer 51A are patterned in a state in which potential of the light-reflecting layer-forming layer 51A is set to a predetermined potential via the substrate 31 or the photoelectric conversion unit 40 (specifically, in a state in which light-reflecting layer-forming layer 51A is grounded via light-blocking layer 47 in the first embodiment). The area 23 between the imaging elements, the optical black pixel area (OPB) 12, and the peripheral area 13 are occupied by the second stacked structure (frame) 56 including the light-reflecting layer 51, the insulating layer 52, and the light-absorbing layer 53. After that, a protective film which is made of insulating material such as $SiO_2$, SiON, SiN, or the like and has a thickness of several tens of nm (specifically, protective film having thickness of 15 nm on side surface of wire grid polarizer 50, for example) may be formed conformally on the entire surface based on the HDP-CVD method or the ALD method as necessary.

<Step 150>

After that, the imaging device may be assembled based on a known method which involves formation of electrode pads (not illustrated), dicing for chip separation, and packaging.

In the imaging element according to the first embodiment, the light-reflecting layer-forming layer is electrically connected to the photoelectric conversion unit, the light-reflecting layer-forming layer electrically connected to the photoelectric conversion unit is prepared, and the extending part of the light-reflecting layer is electrically connected to the photoelectric conversion unit. Therefore, during formation of the wire grid polarizer, it is certainly possible to prevent the wire grid polarizer and the photoelectric conversion unit from being damaged after the light-reflecting layer-forming layer or the light-absorbing layer-forming layer is charged and a kind of discharge occurs.

In addition, since the wire grid polarizers are integrally formed above the photoelectric conversion areas in an on-chip form, it is possible to decrease the thickness of the imaging element. As a result, it is possible to minimize mixing (polarization crosstalk) of polarized light into the adjacent imaging element. Moreover, since the wire grid polarizer is an absorption-type wire grid polarizer having an absorption layer, reflectance is low, and the influence of stray light, flare, or the like on video can be reduced.

In addition, since the imaging device includes the wire grid polarizers, the imaging device can acquire polarization information and a normal captured image at the same time. In other words, the imaging device has a polarization separation function to spatially separate polarization information of incident light. Specifically, each imaging element can obtain light intensity, polarization component intensity, and a polarization direction. Therefore, for example, image data can be processed on the basis of polarization information after capturing an image. For example, by performing a desired process on a part of an image capturing sky or a glass window, a part of an image capturing a water surface, or the like, it is possible to emphasize or understate a polarization component, to separate the polarization component and a non-polarization component, to improve contrast of an image, or to delete unnecessary information. Specifically, such a process can be carried out by setting an image capturing mode when an image is captured by using the imaging device, for example. In addition, the imaging device can delete reflection from a glass window, and can sharpen boundaries (outline) of a plurality of objects by adding polarization information to image information. In addition, it is also possible to detect a status of a road surface and to detect obstacles on the road. It is also possible to capture an image of a pattern reflecting a birefringent property of an object, to measure retardation distribution, to acquire a polarization microscope image, to acquire a surface shape of the object, to measure a surface texture of the object, to detect a moving object (car and the like), and to carry out weather observation for measuring cloud distribution. As described, application or adoption to various kinds of fields is possible. In addition, the imaging device may calculate normal lines on the basis of polarization information, and integrate them to capture a stereoscopic image.

Instead of electrically connecting the light-reflecting layer-forming layer 51A to the photoelectric conversion unit 40, the light-reflecting layer-forming layer 51A may be electrically connected to the substrate 31 (for example, driving circuit, wiring, wiring layer 32). The area in which the substrate 31 or the photoelectric conversion unit 40 is electrically connected to the light-reflecting layer-forming layer 51A may be positioned in the optical black pixel area (OPB) 12 at the outer circumference of the imaging area 11 or may be positioned in the peripheral area 13 outside the imaging area 11. The light-blocking layer is also formed in the peripheral area 13, and the extending part 51a of the light-reflecting layer 51 is in contact with the area of the light-blocking layer. The length of the extending part of the light-reflecting layer in contact with the area of the light-blocking layer can be an arbitrary length inherently. For convenience, in the right side of FIG. 6, parts in which the extending part 51a of the light-reflecting layer 51 is in contact with the area of the light-blocking layer 47 are boxed and denoted with a reference sign "A". In addition, for convenience, in FIG. 6, the areas in which the light-reflecting layer 51 (light-reflecting layer-forming layer 51A) is in contact with the light-absorbing layer 53 (light-absorbing layer-forming layer 53A) are boxed and denoted with a reference sign "B." FIG. 6 illustrates only a part of the areas A and B. Alternatively, although dicing is carried out to cut off chips, sometimes the area in which the substrate 31 or the photoelectric conversion unit 40 is electrically connected to the light-reflecting layer-forming layer 51A may be positioned in a scribe part between imaging devices.

The wire grid polarizer may have a structure in which the insulating layer is omitted. In other words, in the wire grid polarizer, the light-reflecting layer (made of aluminum, for example) and the light-absorbing layer (made of tungsten, for example) are stacked in this order from the photoelectric conversion unit 40 side. Alternatively, the wire grid polarizer may include a single-layer conductor light-blocking material layer. Examples of material constituting the conductor light-blocking material layer includes conductor material having a small complex refraction index in a wavelength band to which the imaging element has sensitivity, such as aluminum (Al), copper (Cu), gold (Au), silver (Ag), platinum (Pt), tungsten (W), or an alloy including such metal.

Second Embodiment

The second embodiment is a modification of the first embodiment, and relates to the imaging element B according to an embodiment of the present disclosure. In this embodiment, the on-chip lens (OCL) is disposed above the wire grid polarizer. The wavelength selection layer (specifically, for example, a known color filter layer) is disposed between the wire grid polarizer (positioned at lower side) and the on-chip lens (positioned at upper side).

Figure 8:
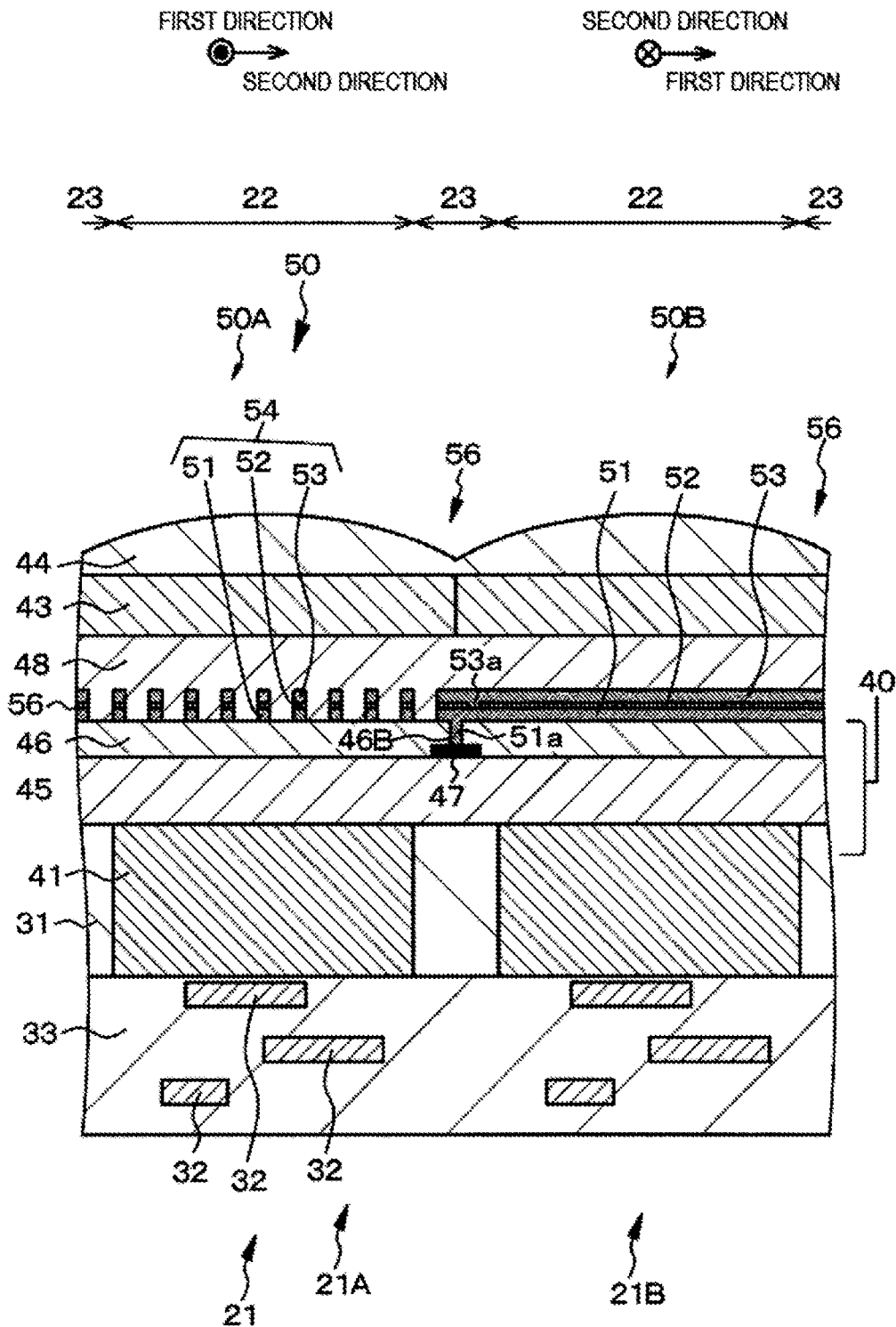
FIG. 8 is a schematic partial end view of imaging elements in an imaging device according to a second embodiment.
Figure 9:
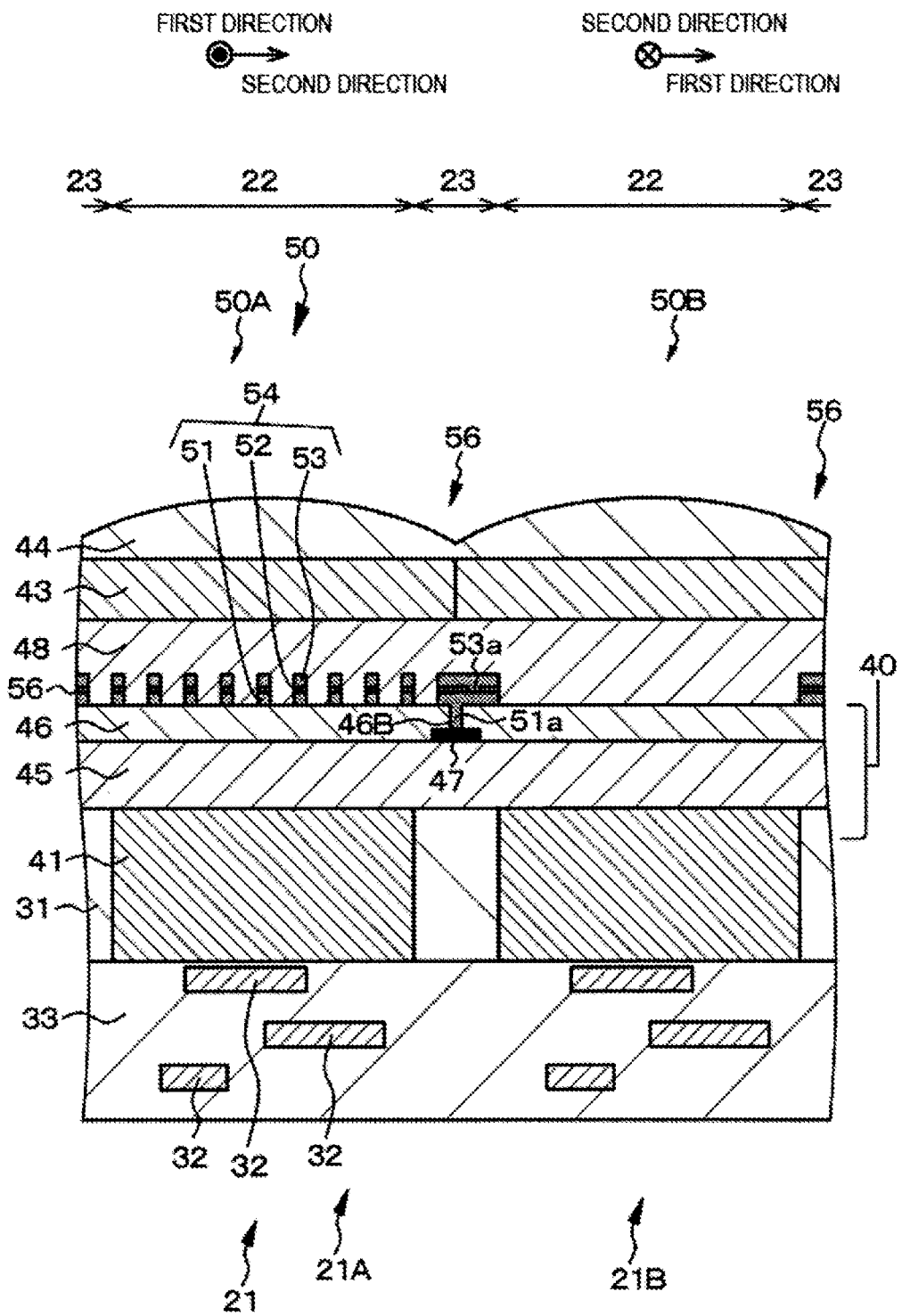
FIG. 9 is a schematic partial end view of imaging elements in an imaging device according to the second embodiment.

Specifically, in the second embodiment, FIG. 8 and FIG. 9 each illustrate the schematic partial end view of the imaging element. The planarizing layer 45 and the base insulating layer 46 are formed above the photoelectric conversion area (light-receiving area) 41, and the wire grid polarizer 50 is formed on the base insulating layer 46. In addition, the third planarizing film 48 (wire grid polarizer embedded material layer), the wavelength selection layer (color filter layer 43), and the on-chip lens 44 are formed above the wire grid polarizer 50. The photoelectric conversion unit 40 includes the photoelectric conversion area (light-receiving area) 41, the planarizing layer 45, and the base insulating layer 46. The light-blocking layer 47 is on the planarizing layer 45, and the first opening 46B is formed in a part of the base insulating layer 46 positioned above the light-blocking layer 47. The third planarizing film 48 is made of $SiO_2$, acrylic resin, SOG, or the like. The arrangement of imaging elements is the Bayer arrangement also in the second embodiment. FIG. 8 is the schematic partial end view similar to the drawing along arrows A-A in FIGS. 3 and 4, and FIG. 9 is the schematic partial end view similar to the drawing along arrows B-B in FIGS. 3 and 4.

In the second embodiment, the wire grid polarizer is in between the photoelectric conversion area 41 and the on-chip lens 44, and is closer to the substrate side than the wavelength selection layer (specifically, color filter layer 43). Therefore, the wire grid polarizer 50 is formed before formation of the color filter layer, and a processing temperature is nearly unlimited. In addition, the wire grid polarizer 50 is embedded in the third planarizing film 48. Accordingly, it is possible to surely prevent damage to the wire grid polarizer due to dicing for cutting off chips when the imaging device is mounted on a package. In addition, since the wire grid polarizer 50 is positioned near the photoelectric conversion area 41, leakage of light into adjacent imaging elements (polarization crosstalk) can be prevented.

While preferred embodiments of the present disclosure have been described, the present disclosure is not limited to these embodiments. The configuration and structure of the wire grid polarizer, the imaging element, and the imaging device described in the embodiments are exemplary, and can be changed appropriately. The methods of manufacturing thereof are also exemplary, and can be changed appropriately. Instead of the back-illuminated imaging element, the imaging element may be a front-illuminated imaging element. Specifically, for example, in the imaging element, the photoelectric conversion area 41 in the silicon semiconductor substrate, the first planarizing film 42, the wavelength selection layer (color filter layer) 43, the on-chip lens 44, the planarizing layer (second planarizing film) 45, the light-blocking layer 47, the base insulating layer 46, and the wire grid polarizer 50 are stacked in this order. Alternatively, in the imaging element, the photoelectric conversion area 41 in the silicon semiconductor substrate, the planarizing layer 45, the light-blocking layer 47, the base insulating layer 46, and the wire grid polarizer 50, the third planarizing film 48, the wavelength selection layer (color filter layer) 43, and the on-chip lens 44 are stacked in this order.

In the embodiments, the wire grid polarizer is used mainly for acquiring polarization information in the imaging element having sensitivity to a visible light wavelength band. However, in the case where the imaging element has sensitivity to infrared or ultraviolet light, a wire grid polarizer functioning in an arbitrary wavelength band can be mounted by enlarging/reducing the pitch $P_0$ at which the stacked structure has been formed according to the sensitivity of the imaging element. In addition, a wire grid polarizer may be embodied as the disclosure alone when the plurality of stacked structures are separately placed side by side in the wire grid polarizer, the light-reflecting layer, the insulating layer, and the light-absorbing layer are stacked in this order in each of the stacked structures from the photoelectric conversion unit side, the insulating layer is on the whole top surface of the light-reflecting layer, and the light-absorbing layer is on the whole top surface of the insulating layer.

The arrangement state of the imaging elements in the imaging element unit having the Bayer arrangement is not limited to FIG. 10. In the planner layout of the imaging element units in FIGS. 11 to 24 to be described below, "R" represents a red imaging element having a red color filter layer, "G" represents a green imaging element having a green color filter layer, "B" represents a blue imaging element having a blue color filter layer, and "W" represents a white imaging element having no color filter layer.

Figure 11:
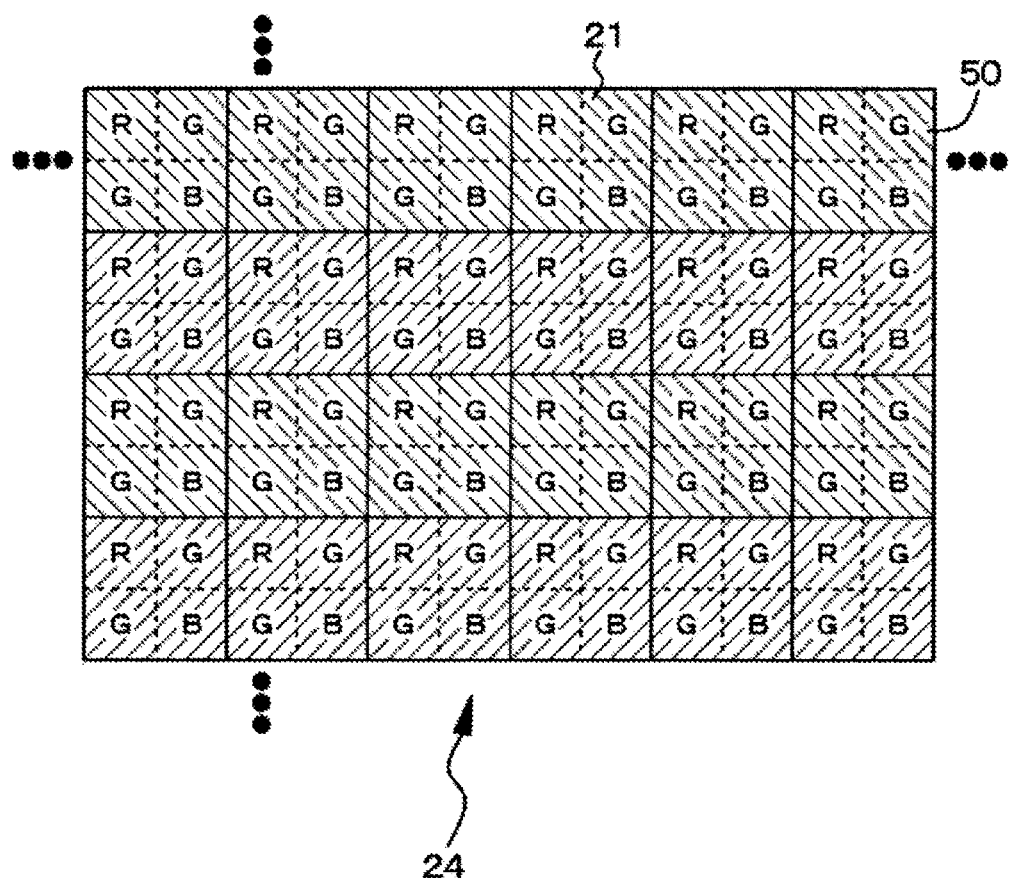
FIG. 11 is a conceptual diagram of a modification of imaging element units having the Bayer arrangement in an imaging device according to the first embodiment or the second embodiment.

As illustrated in FIG. 11, for example, imaging elements having an angle of 45 degrees between the first direction and a direction in which a plurality of imaging elements are arranged, and imaging elements having an angle of 135 degrees between the first direction and the direction in which a plurality of imaging elements are arranged can be combined.

Figure 12:
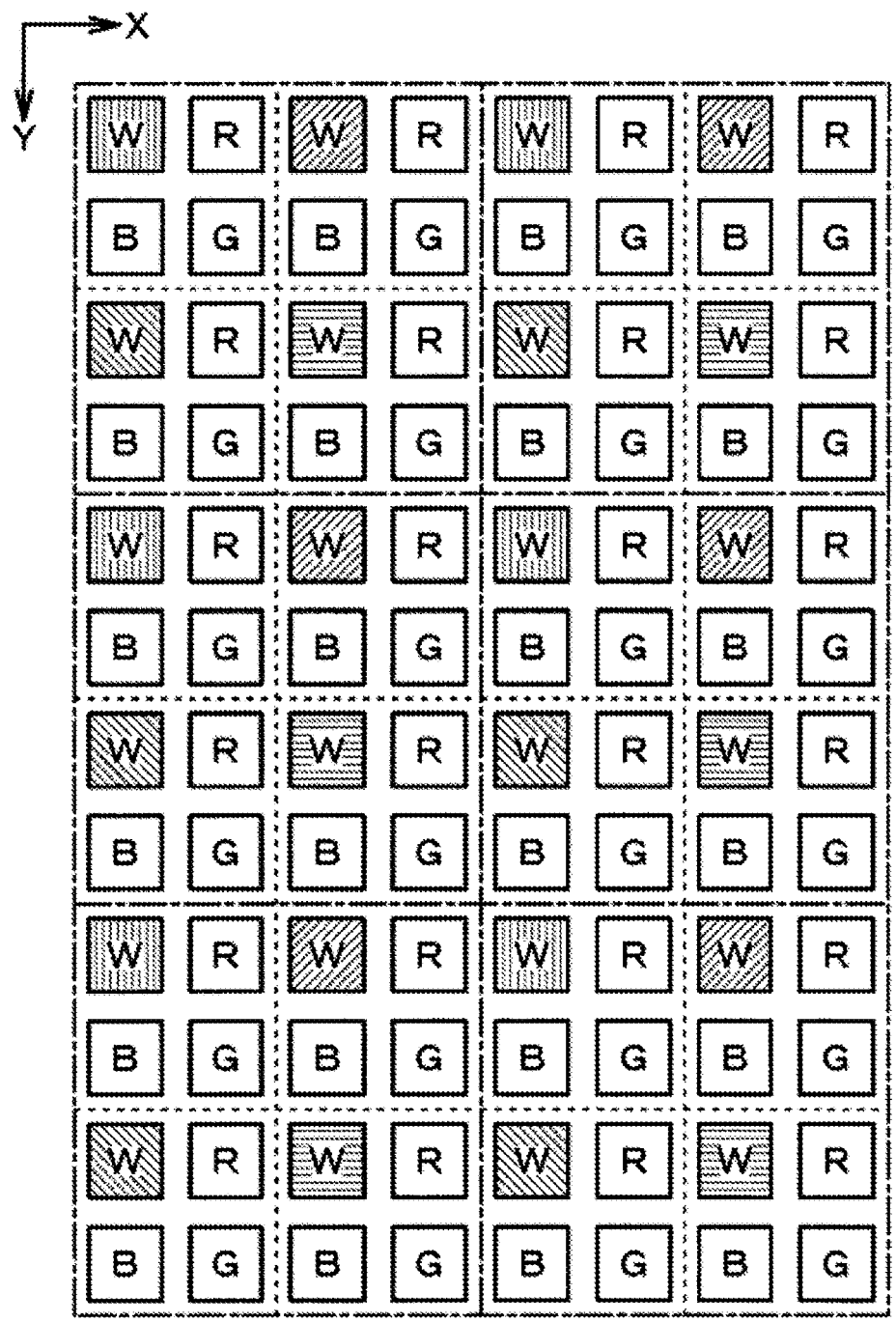
FIG. 12 is a conceptual diagram of a modification of imaging element unitshaving the Bayer arrangement in an imaging device according to the first embodiment or the second embodiment.

In the example in FIG. 12, the red imaging elements R, the green imaging elements G, and the blue imaging elements B do not have the wire grid polarizer 50, and the white imaging elements W have the wire grid polarizers 50. In FIG. 12, the white imaging elements W each having the wire grid polarizer 50 are disposed at every other imaging element in an X direction and a Y direction. However, the white imaging elements W may be disposed at every two or three imaging elements, or the imaging elements each having the wire grid polarizer 50 may be disposed in a houndstooth pattern.

Figure 13:
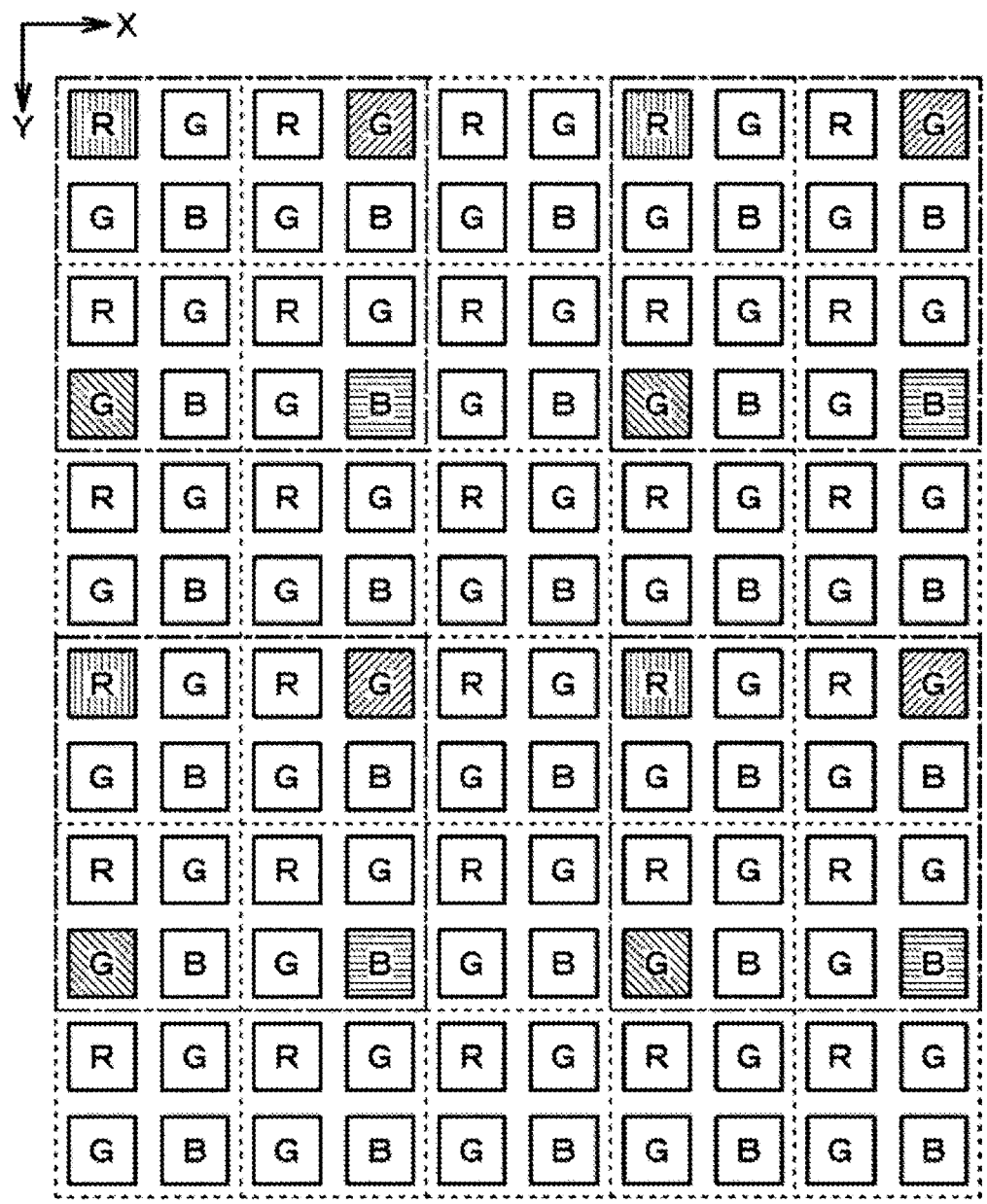
FIG. 13 is a conceptual diagram of a modification of imaging element units having the Bayer arrangement in an imaging device according to the first embodiment or the second embodiment.

As illustrated in the planer layout in FIG. 13, the arrangement of the color filter layers may be basically the Bayer arrangement. The red, green, and blue color filter layers may be disposed in one imaging element unit (one pixel) made of four (2×2) imaging elements. One imaging-element-unit group may be made of four imaging element units, and the wire grid polarizer may be disposed in one of the four imaging elements constituting each imaging element unit.

Figure 14:
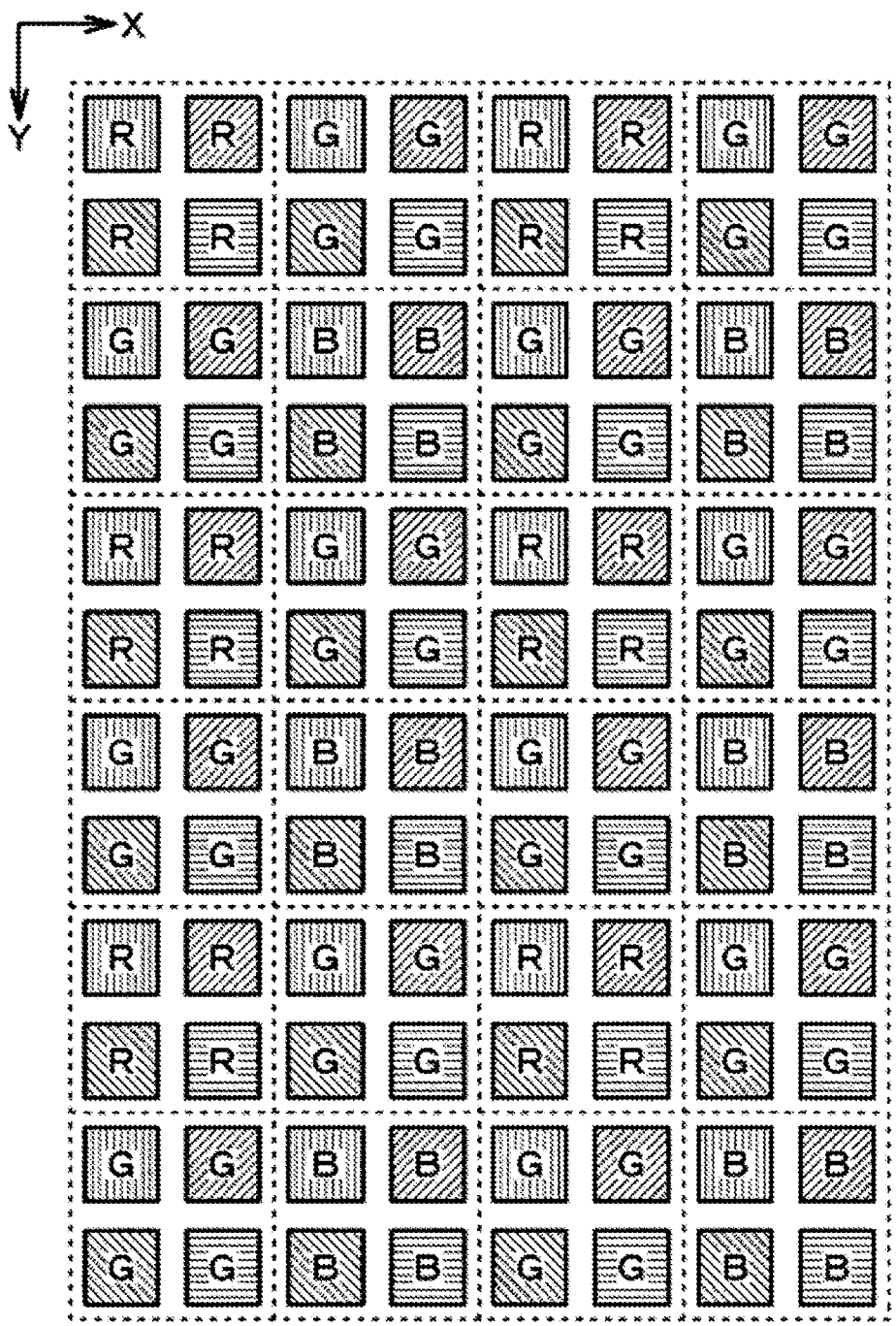
FIG. 14 is a conceptual diagram of a modification of imaging element units having the Bayer arrangement in an imaging device according to the first embodiment or the second embodiment.
Figure 15:
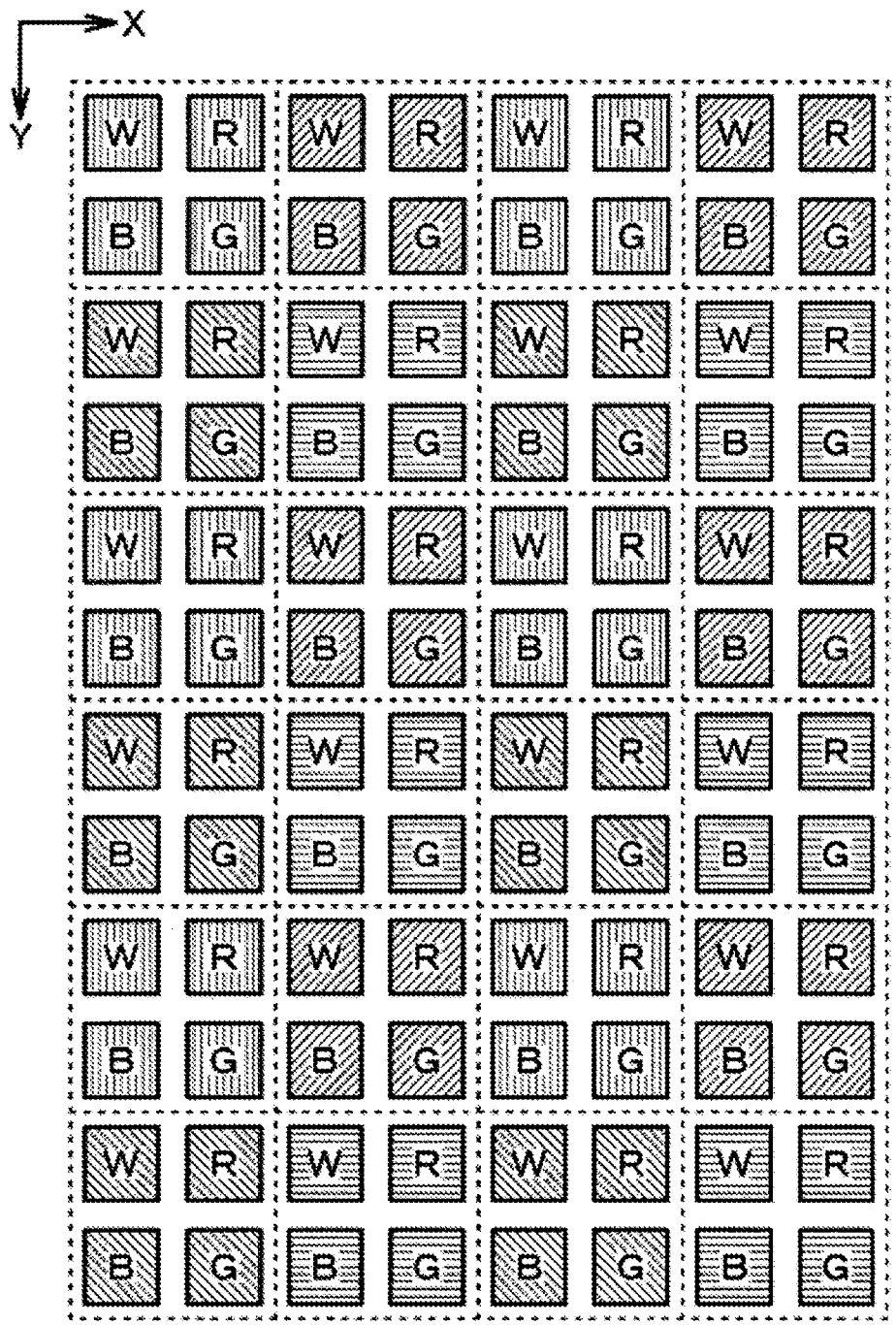
FIG. 15 is a conceptual diagram of a modification of imaging element units having the Bayer arrangement in an imaging device according to the first embodiment or the second embodiment.
Figure 16:
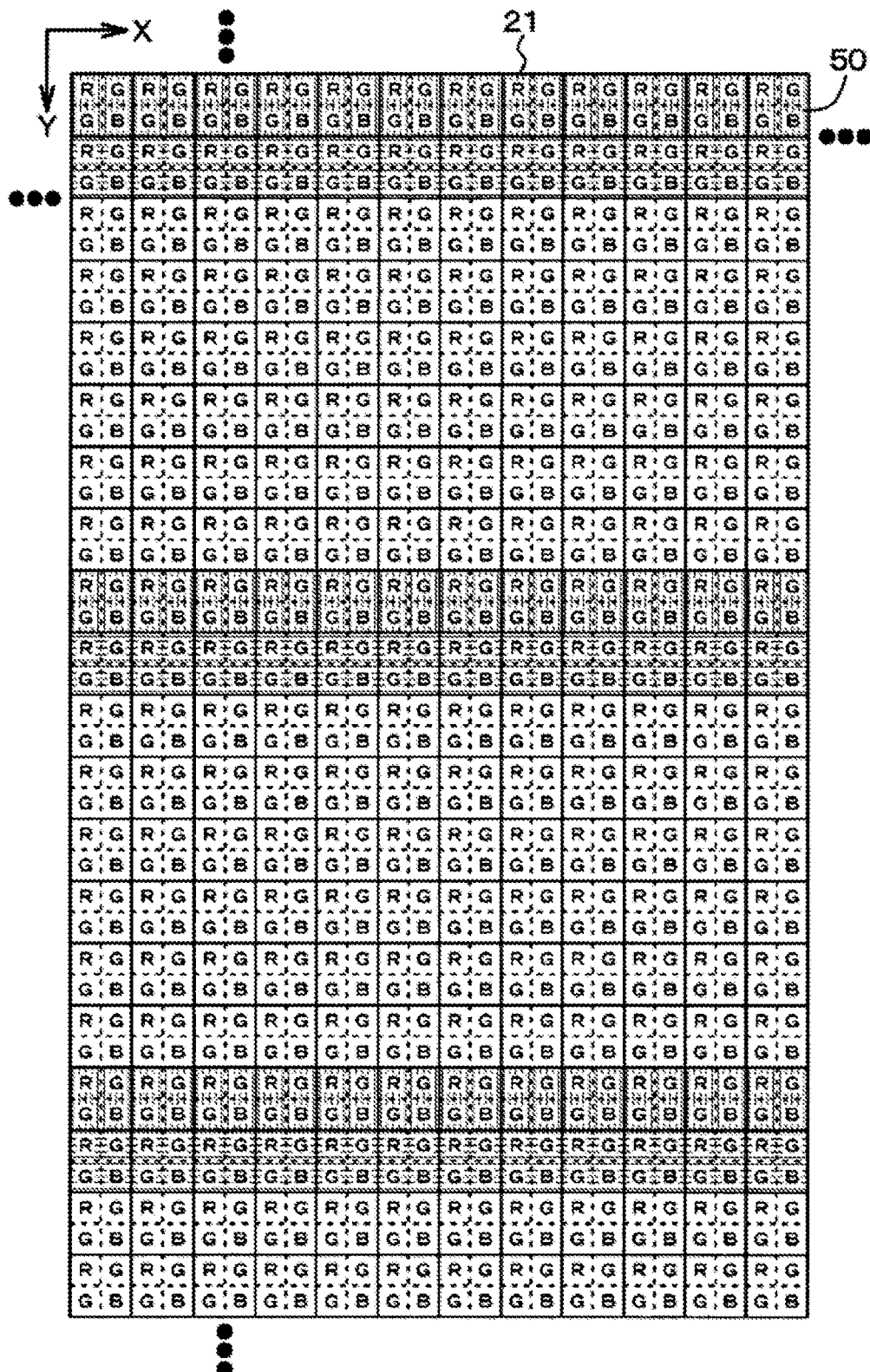
FIG. 16 is a conceptual diagram of a modification of imaging element units having the Bayer arrangement in an imaging device according to the first embodiment or the second embodiment.
Figure 17:
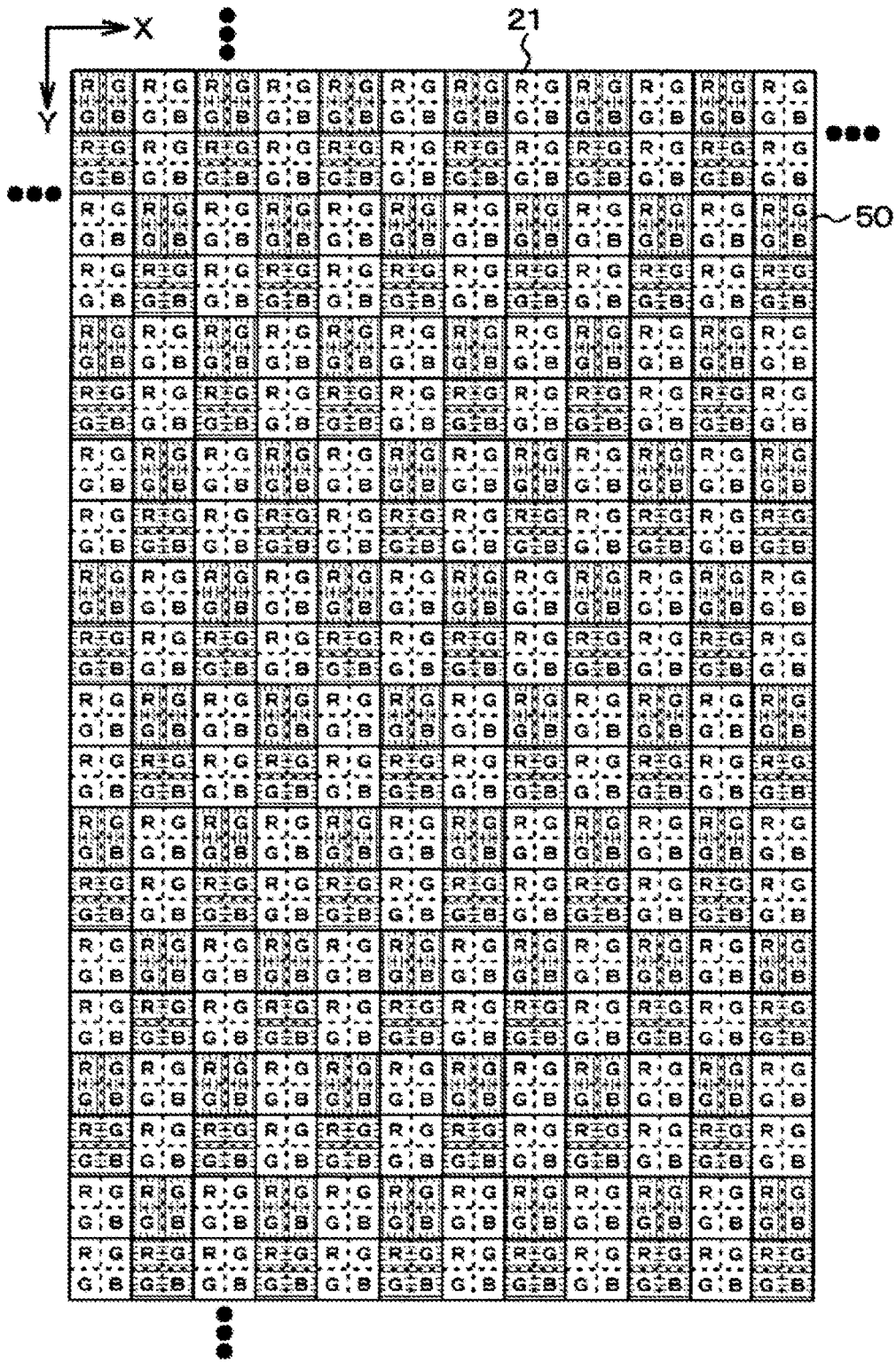
FIG. 17 is a conceptual diagram of a modification of imaging element units having the Bayer arrangement in an imaging device according to the first embodiment or the second embodiment.
Figure 18:
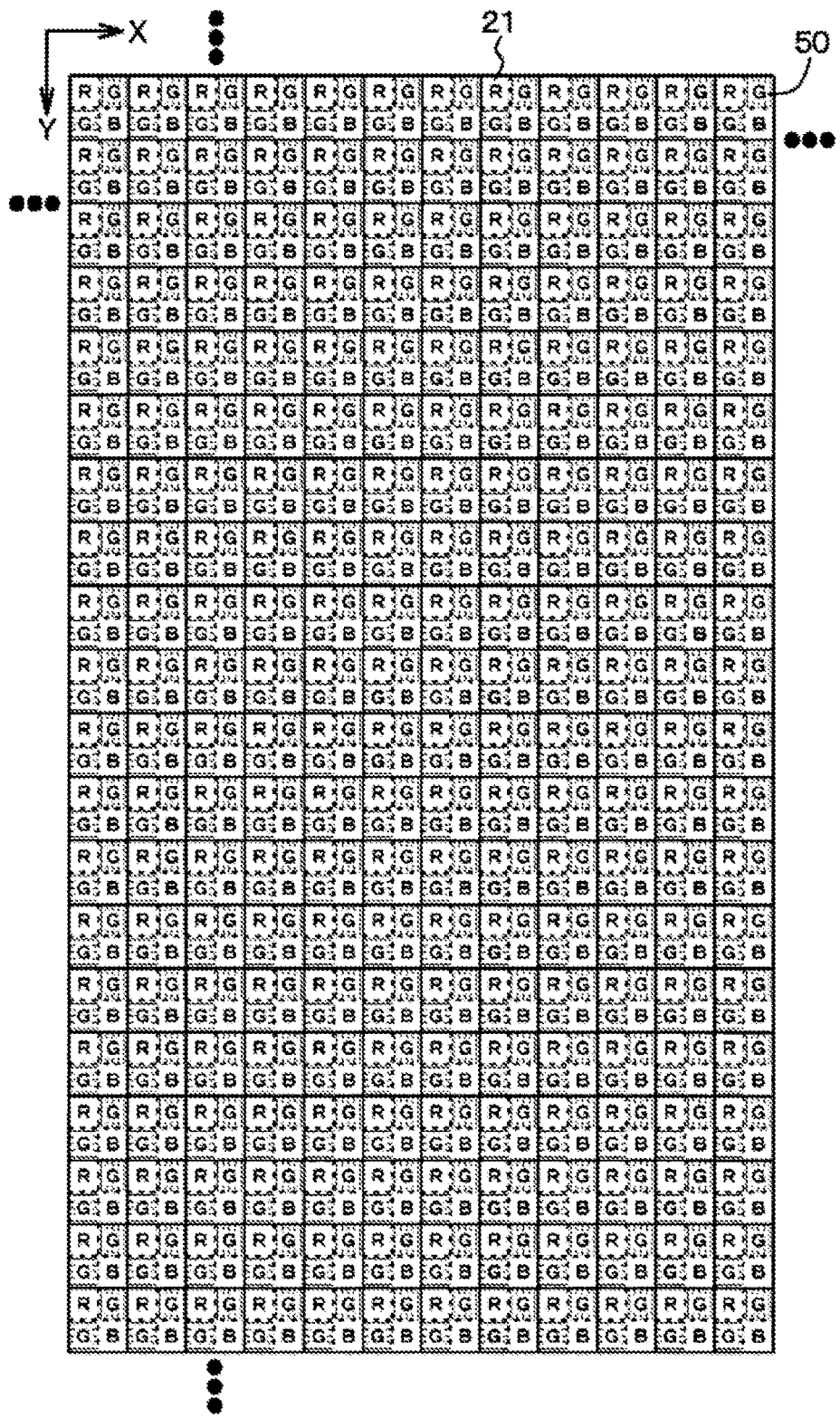
FIG. 18 is a conceptual diagram of a modification of imaging element units having the Bayer arrangement in an imaging device according to the first embodiment or the second embodiment.
Figure 19:
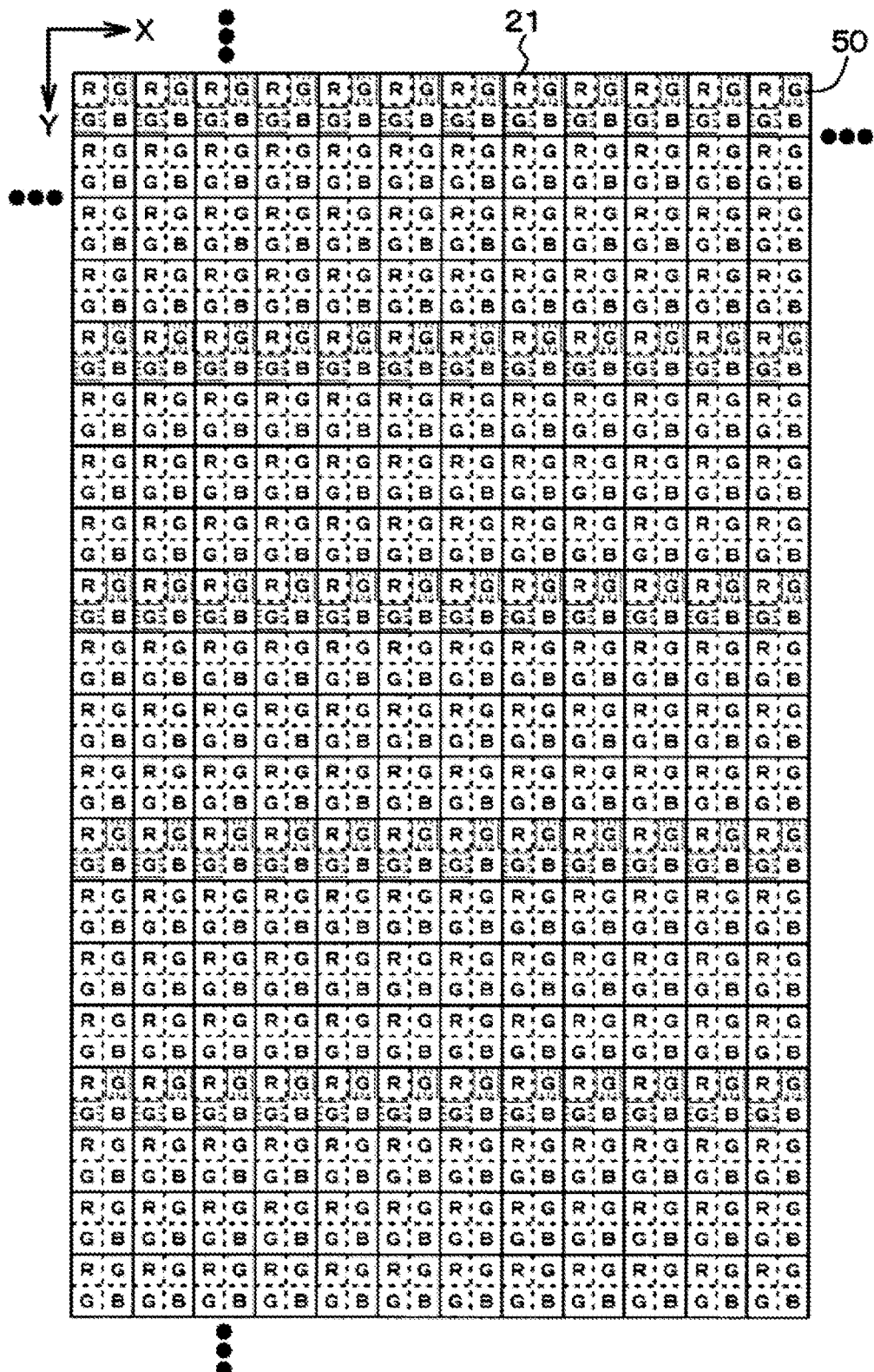
FIG. 19 is a conceptual diagram of a modification of imaging element units having the Bayer arrangement in an imaging device according to the first embodiment or the second embodiment.
Figure 20:
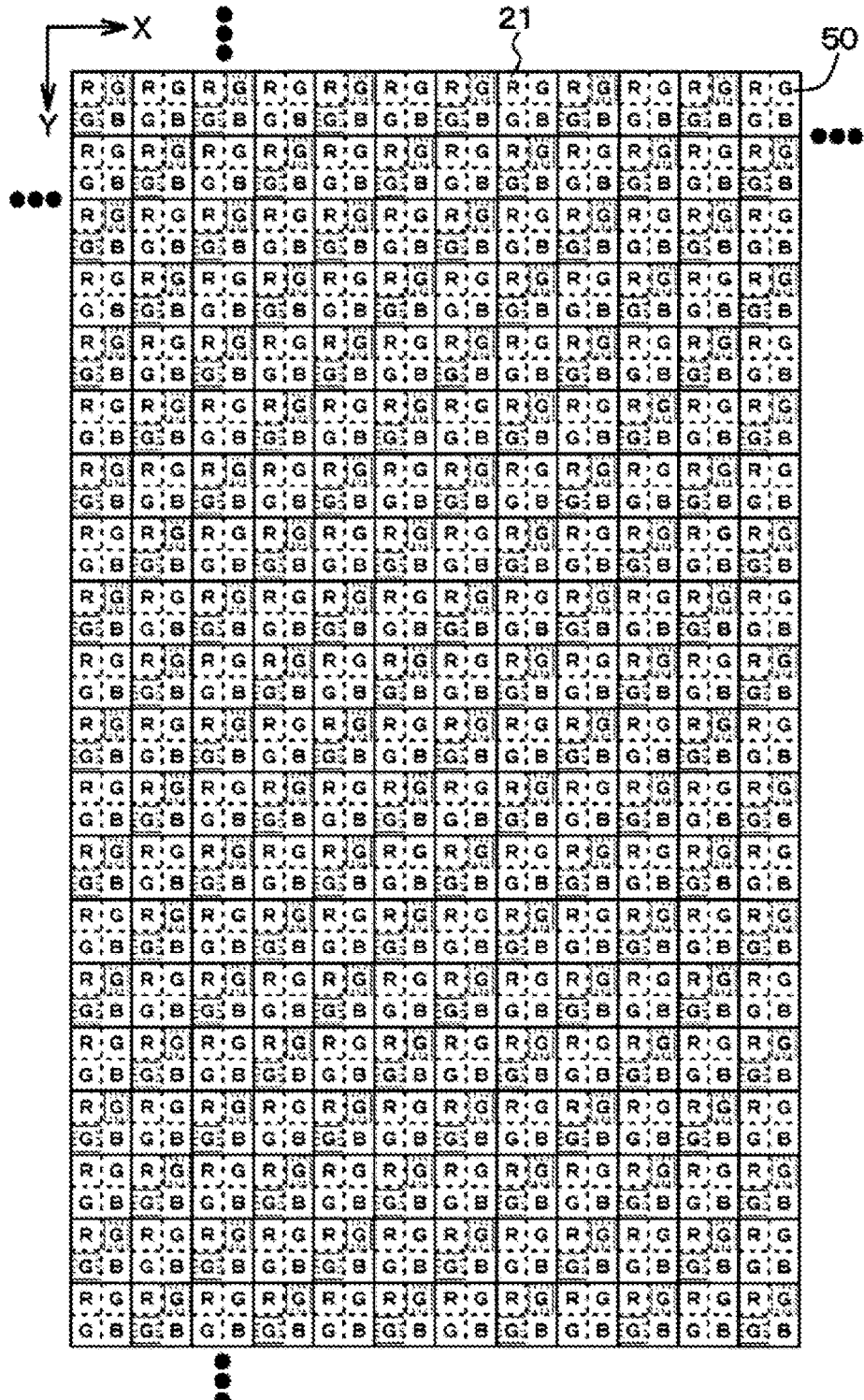
FIG. 20 is a conceptual diagram of a modification of imaging element units having the Bayer arrangement in an imaging device according to the first embodiment or the second embodiment.
Figure 21:
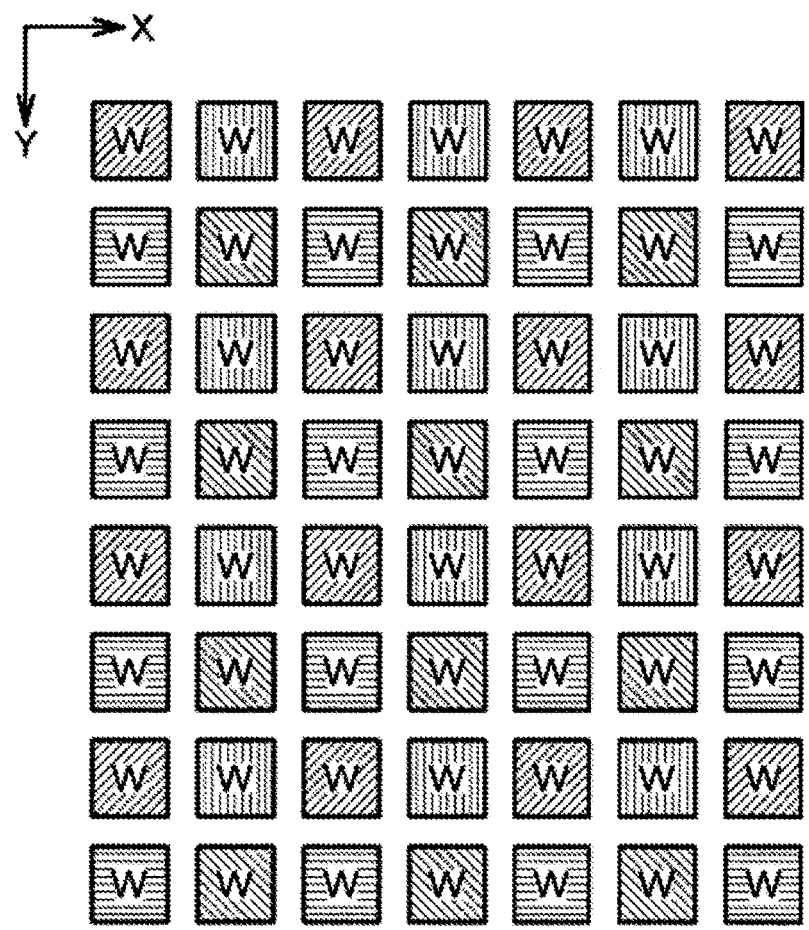
FIG. 21 is a conceptual diagram of a modification of imaging element units having the Bayer arrangement in an imaging device according to the first embodiment or the second embodiment.
Figure 22:
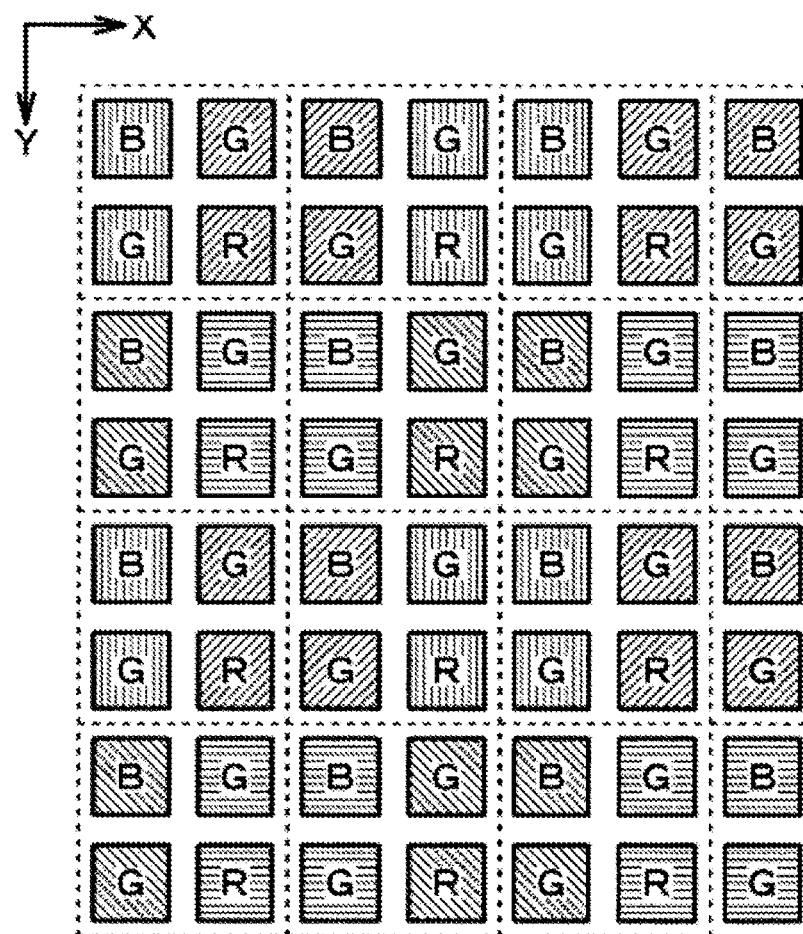
FIG. 22 is a conceptual diagram of a modification of imaging element units having the Bayer arrangement in an imaging device according to the first embodiment or the second embodiment.
Figure 23:
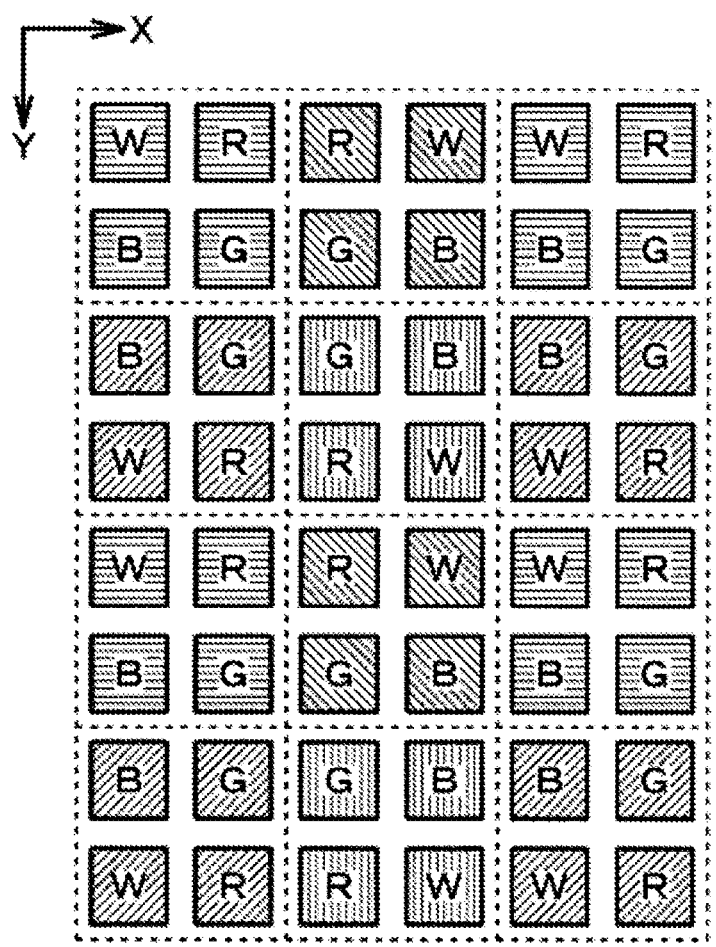
FIG. 23 is a conceptual diagram of a modification of imaging element units having the Bayer arrangement in an imaging device according to the first embodiment or the second embodiment.
Figure 24:
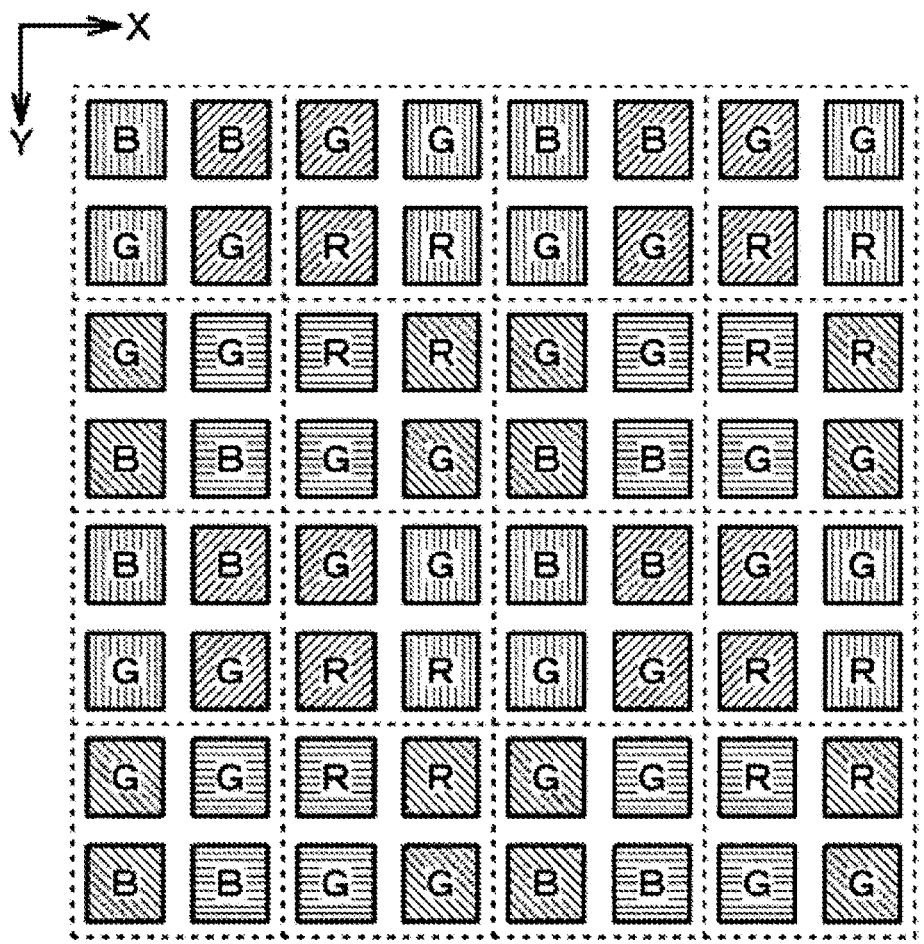
FIG. 24 is a conceptual diagram of a modification of imaging element units having the Bayer arrangement in an imaging device according to the first embodiment or the second embodiment.
Figure 25:
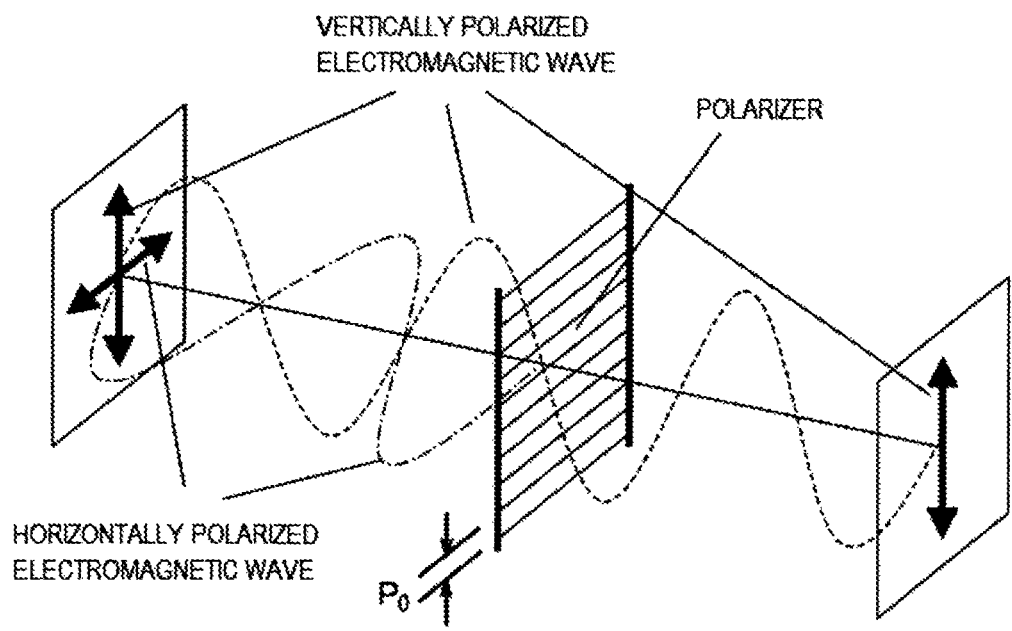
FIG. 25 is a conceptual diagram illustrating light and the like passing through a wire grid polarizer.

It is also possible to use a configuration illustrated in the planer layout in FIG. 14 or FIG. 15. In the case of a CMOS image sensor having the planer layout in FIG. 14, a 2×2 pixels sharing method in which a selection transistor, a reset transistor, and an amplification transistor are shared by 2×2 imaging elements can be used. An image including polarization information is captured in an image capturing mode in which pixel summation is not performed, and a normally captured image in which all polarization components are integrated is provided in a mode in which FD addition of accumulated charge in 2×2 subpixel areas is performed. In the case of the planer layout in FIG. 15, the wire grid polarizers are disposed in one direction in 2×2 imaging elements. Therefore, it is difficult to form discontinuous stacked structures between the imaging element units, and high-quality polarization imaging can be carried out.

It is also possible to use a configuration illustrated in the planer layout in FIG. 16, FIG. 17, FIG. 18, FIG. 19, FIG. 20, FIG. 21, FIG. 22, FIG. 23, and FIG. 24.

It should be understood by those skilled in the art that various modifications, combinations, sub-combinations, and alterations may occur depending on design requirements and other factors insofar as they are within the scope of the appended claims or the equivalents thereof.

Additionally, the present technology may also be configured as below.

(A01) <<Method of Manufacturing Imaging Device>>

A method of manufacturing an imaging device including a plurality of imaging elements in an imaging area,
   each of the imaging elements including
   a photoelectric conversion unit on a substrate, and
   a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer,
   the method including:
   manufacturing each of the imaging elements by
   (a) forming a light-reflecting layer-forming layer made of a first electrical conducting material on the photoelectric conversion unit after forming the photoelectric conversion unit,
   (b) next, on or above the light-reflecting layer-forming layer, forming a light-absorbing layer-forming layer which is made of a second electrical conducting material and at least a part of which is in contact with the light-reflecting layer-forming layer, and
   (c) subsequently, patterning the light-absorbing layer-forming layer and the light-reflecting layer-forming layer to obtain the wire grid polarizer in which the plurality of stacked structures are separately placed side by side, each of the stacked structures including the band-like light-reflecting layer and the band-like light-absorbing layer, wherein, in (a), the light-reflecting layer-forming layer made of the first electrical conducting material is electrically connected to the substrate or the photoelectric conversion unit.

(A02)

The method of manufacturing an imaging device according to (A01), wherein the light-reflecting layer and the light-absorbing layer are shared by the imaging elements.

(A03)

The method of manufacturing an imaging device according to (A01) or (A02), wherein in (b), the light-absorbing layer-forming layer made of the second electrical conducting material is formed on or above the light-reflecting layer-forming layer in a state in which potential of the light-reflecting layer-forming layer is set to a predetermined potential via the substrate or the photoelectric conversion unit, and in (c), the light-absorbing layer-forming layer and the light-reflecting layer-forming layer are patterned in a state in which the potential of the light-reflecting layer-forming layer is set to a predetermined potential via the substrate or the photoelectric conversion unit.

(A04)
The method of manufacturing an imaging device according to any one of (A01) to (A03), wherein
an area in which the substrate or the photoelectric conversion unit is electrically connected to the light-reflecting layer-forming layer is positioned in the imaging area.

(A05)
The method of manufacturing an imaging device according to any one of (A01) to (A03), wherein
an area in which the substrate or the photoelectric conversion unit is electrically connected to the light-reflecting layer-forming layer is positioned in an optical black pixel area at an outer circumference of the imaging area.

(A06)
The method of manufacturing an imaging device according to any one of (A01) to (A03), wherein
an area in which the substrate or the photoelectric conversion unit is electrically connected to the light-reflecting layer-forming layer is positioned in a peripheral area outside the imaging area.

(A07)
The method of manufacturing an imaging device according to any one of (A01) to (A06), wherein
in the wire grid polarizer, the light-reflecting layer, an insulating layer, and the light-absorbing layer are stacked in this order from the photoelectric conversion unit side.

(A08)
The method of manufacturing an imaging device according to (A07), wherein the insulating layer is formed on a whole top surface of the light-reflecting layer, and the light-absorbing layer is formed on a whole top surface of the insulating layer.

(A09)
A method of manufacturing an imaging device including a plurality of imaging elements in an imaging area, each imaging element including a photoelectric conversion unit in a substrate and a wire grid polarizer arranged at a light-incident side of the photoelectric conversion unit, the method including:
forming the photoelectric conversion unit in the substrate;
forming a light-reflecting layer on or above the photoelectric conversion unit, wherein the light-reflecting layer includes a first electrical conducting material that is electrically connected to at least one of the substrate or the photoelectric conversion unit;
forming a light-absorbing layer on or above the light-reflecting layer, wherein the light-absorbing layer includes a second electrical conducting material, and wherein at least a portion of the light-absorbing layer is in contact with the light-reflecting layer; and
patterning the light-absorbing layer and the light-reflecting layer to form a wire grid polarizer including a plurality of stacked strip-shaped portions, wherein each of the plurality of stacked strip-shaped portions includes a portion of the light-reflecting layer and a portion of the light-absorbing layer.

(A10)
The method of manufacturing an imaging device according to (A09), further including: forming an insulating layer on or above the light-reflecting layer; and
forming an opening in the insulating layer, wherein the insulating layer is between the light light-reflecting layer and the light-absorbing layer, and wherein each of the of the plurality of stacked strip-shaped portions includes the portion of the light-reflecting layer, a portion of the insulating layer, and the portion of the light-absorbing layer.

(A11)
The method of manufacturing an imaging device according to (A09) or (A10), further including:
setting a potential of the light-reflecting layer to a predetermined potential via the substrate or the photoelectric conversion unit; and
patterning the light-absorbing layer and the light-reflecting layer to form the wire grid polarizer while the potential of the light-reflecting layer is set to the predetermined potential.

(A12)
The method of manufacturing an imaging device according to (A09), further including: forming an insulating layer on or above the photoelectric conversion unit;
forming a light-blocking layer on the insulation layer; and
forming an opening in the insulating layer, wherein the light-reflecting layer is in electrical contact with the light-blocking layer.

(A13)
The method of manufacturing an imaging device according to any one of (A09) to (A12), wherein an area in which the substrate or the photoelectric conversion unit is electrically connected to the light-reflecting layer is positioned in an imaging area of the imaging device.

(A14)
The method of manufacturing an imaging device according to any one of (A09) to (A13), wherein an area in which the substrate or the photoelectric conversion unit is electrically connected to the light-reflecting layer is positioned in an optical black pixel area at an outer circumference of an imaging area of the imaging device.

(A15)
The method of manufacturing an imaging device according to any one of (A09) to (A14), wherein an area in which the substrate or the photoelectric conversion unit is electrically connected to the light-reflecting layer is positioned in a peripheral area outside an imaging area of imaging device.

(A16)
The method of manufacturing an imaging device according to any one of (A09) to (A15), wherein the light-reflecting layer and the light-absorbing layer are shared by a plurality of imaging elements in the imaging apparatus.

(A17)
The method of manufacturing an imaging device according to any one of (A09) to (A16), wherein the first electrical conducting material includes aluminum (AL) and the second electrical conducting material includes tungsten (W).

(A18)
The method of manufacturing an imaging device according to any one of (A09) to (A17), wherein the substrate is made of silicon (Si).

(A19)
The method of manufacturing an imaging element according to any one of (A09) to (A18), wherein the plurality of stacked strip-shaped portions extends in a continuous manner above a plurality of photoelectric conversion units.

(B01) <<Method of Manufacturing Imaging Element>>

A method of manufacturing an imaging element including a photoelectric conversion unit on a substrate, and a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer, the method including:

(A) after forming the photoelectric conversion unit, forming a light-reflecting layer-forming layer which is made of a first electrical conducting material and which is electrically connected to the substrate or the photoelectric conversion unit, on the photoelectric conversion unit;

(B) next, on or above the light-reflecting-layer forming layer, forming a light-absorbing layer-forming layer which is made of a second electrical conducting material and at least a part of which is in contact with the light-reflecting layer-forming layer; and (C) subsequently, patterning the light-absorbing layer-forming layer and the light-reflecting layer-forming layer to obtain the wire grid polarizer in which the plurality of stacked structures are separately placed side by side, each of the stacked structures including the band-like light-reflecting layer and the band-like light-absorbing layer.

(B02)

The method of manufacturing an imaging element according to (B01), wherein in (B), the light-absorbing layer-forming layer made of the second electrical conducting material is formed on or above the light-reflecting layer-forming layer in a state in which potential of the light-reflecting layer-forming layer is set to a predetermined potential via the substrate or the photoelectric conversion unit, and in (C), the light-absorbing layer-forming layer and the light-reflecting layer-forming layer are patterned in a state in which the potential of the light-reflecting layer-forming layer is set to a predetermined potential via the substrate or the photoelectric conversion unit.

(C01) <<Imaging Device>>

An imaging device including a plurality of imaging elements in an imaging area, each of the imaging elements including a photoelectric conversion unit on a substrate, and a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer, wherein the light-reflecting layer is made of a first electrical conducting material, the light-absorbing layer is made of a second electrical conducting material, and an extending part of the light-reflecting layer is electrically connected to the substrate or the photoelectric conversion unit.

(C02)

The imaging device according to (C01), wherein the light-reflecting layer and the light-absorbing layer are shared by the imaging elements.

(C03)

The imaging device according to (C01) or (C02), wherein an area in which the extending part of the light-reflecting layer is electrically connected to the substrate or the photoelectric conversion unit is positioned in the imaging area.

(C04)

The imaging device according to (C01) or (C02), wherein an area in which the extending part of the light-reflecting layer is electrically connected to the substrate or the photoelectric conversion unit is positioned in an optical black pixel area at an outer circumference of the imaging area.

(C05)

The imaging device according to (C01) or (C02), wherein an area in which the extending part of the light-reflecting layer is electrically connected to the substrate or the photoelectric conversion unit is positioned in a peripheral area outside the imaging area.

(C06)

The imaging device according to any one of (C01) to (C05), wherein in the wire grid polarizer, the light-reflecting layer, an insulating layer, and the light-absorbing layer are stacked in this order from the photoelectric conversion unit side.

(C07)

The imaging device according to (C06), wherein the insulating layer is on a whole top surface of the light-reflecting layer, and the light-absorbing layer is on a whole top surface of the insulating layer.

(C08)

The imaging device according to any one of (C01) to (C07), wherein a base film is in between the photoelectric conversion unit and the light-reflecting layer.

(C09)

An imaging device including:

a plurality of imaging elements in an imaging area, each imaging element including:

a photoelectric conversion unit in a substrate;

a wire grid polarizer disposed at a light-incident side of the photoelectric conversion unit, the wire grid polarizer including a plurality of stacked strip-shaped portions, each stacked strip-shaped portion including a light-reflecting layer and a light-absorbing layer; and an extending portion of the light-reflecting layer electrically connected to the substrate or the photoelectric conversion unit, wherein, the light-reflecting layer includes a first electrical conducting material, and the light-absorbing layer includes a second electrical conducting material.

(D01) <<Imaging Element>>

An imaging element including:

a photoelectric conversion unit on a substrate; and a wire grid polarizer which is arranged at a light-incident side of the photoelectric conversion unit and in which a plurality of stacked structures are separately placed side by side, each of the stacked structures including at least a band-like light-reflecting layer and a band-like light-absorbing layer, wherein the light-reflecting layer is made of a first electrical conducting material, the light-absorbing layer is made of a second electrical conducting material, and an extending part of the light-reflecting layer is electrically connected to the substrate or the photoelectric conversion unit.

(D02)

An imaging element including:

a photoelectric conversion unit in a substrate;

a wire grid polarizer disposed at a light-incident side of the photoelectric conversion unit, the wire grid polarizer including a plurality of stacked strip-shaped portions, each stacked strip-shaped portion including a light-reflecting layer and a light-absorbing layer; and an extending portion of the light-reflecting layer electrically connected to the substrate or the photoelectric conversion unit, wherein, the light-reflecting layer includes a first electrical conducting material, and the light-absorbing layer includes a second electrical conducting material.

(D03)

The imaging element according to (D02), further including:

an insulating layer formed on or above the light-reflecting layer; and an opening in the insulating layer, wherein the insulating layer is between the light light-reflecting layer and the light-absorbing layer, and wherein each of the of the plurality of stacked strip-shaped portions includes the portion of the light-reflecting layer, a portion of the insulating layer, and the portion of the light-absorbing layer.

(D04)

The imaging element according to (D02) or (D03), wherein a potential of the light-reflecting layer is set to a predetermined potential via the substrate or the photoelectric conversion unit, and the light-absorbing layer and the light-reflecting layer are patterned to form the wire grid polarizer while the potential of the light-reflecting layer is set to the predetermined potential.

(D05)

The imaging element according to (D02), further comprising:

an insulating layer formed on or above the photoelectric conversion unit;

a light-blocking layer formed on the insulation layer; and an opening in the insulating layer, wherein the light-reflecting layer is in electrical contact with the light-blocking layer.

(D06)

The imaging element according to any one of (D02) to (D05), wherein an area in which the substrate or the photoelectric conversion unit is electrically connected to the light-reflecting layer is positioned in an imaging area of the imaging element.

(D07)

The imaging element according to any one of (D02) to (D06), wherein an area in which the substrate or the photoelectric conversion unit is electrically connected to the light-reflecting layer is positioned in an optical black pixel area at an outer circumference of an imaging area of an imaging device.

(D08)

The imaging element according to any one of (D02) to (D07), wherein an area in which the substrate or the photoelectric conversion unit is electrically connected to the light-reflecting layer-forming layer is positioned in a peripheral area outside an imaging area of an imaging device.

(D09)

The imaging element according to any one of (D02) to (D08), wherein the light-reflecting layer and the light-absorbing layer are shared by a plurality of imaging elements in an imaging apparatus.

(E01) <<Imaging Device>>

An imaging device including a plurality of imaging elements in an imaging area, each of the imaging elements including a photoelectric conversion unit on a substrate, and a wire grid polarizer, wherein in the wire grid polarizer, a plurality of band-like stacked structures are separately placed side by side, each of the stacked structures including the light-reflecting layer, an insulating layer, and the light-absorbing layer in this order from the photoelectric conversion unit side, and the insulating layer is formed on a whole top surface of the light-reflecting layer, and the light-absorbing layer is formed on a whole top surface of the insulating layer.

(E02)

The imaging device according to (E01), wherein the light-reflecting layer and the light-absorbing layer are shared by the imaging elements.

(E03) <<Imaging Element>>

An imaging element including:

a photoelectric conversion unit on a substrate; and a wire grid polarizer, wherein in the wire grid polarizer, a plurality of band-like stacked structures are separately placed side by side, each of the stacked structures including the light-reflecting layer, an insulating layer, and the light-absorbing layer in this order from the photoelectric conversion unit side, and the insulating layer is formed on a whole top surface of the light-reflecting layer, and the light-absorbing layer is formed on a whole top surface of the insulating layer.

REFERENCE SIGNS LIST 10 imaging device
11 imaging area
12 optical black pixel area (OPB)
13 peripheral area
21, 21A, 21B imaging element
22 area occupied by imaging element
23 area between imaging elements
24 imaging element unit
31 substrate
32 driving circuit and wiring (wiring layer)
33 interlayer insulating film
40 photoelectric conversion unit
41 photoelectric conversion area
42 first planarizing film
43 wavelength selection layer (color filter layer)
44 on-chip lens
45 planarizing layer (second planarizing film)
46 base insulating layer
46B first opening
47 light-blocking layer
48 third planarizing film
50, 50A, 50B wire grid polarizer
51 light-reflecting layer
51A light-reflecting layer-forming layer
51a extending part of light-reflecting layer or light-reflecting layer-forming layer
52 insulating layer
52A insulating layer-forming layer
52B second opening
53 light-absorbing layer
53A light-absorbing layer-forming layer
53a extending part of light-absorbing layer or light-absorbing layer-forming layer
54 stacked structure
55 gap (space) between stacked structures
56 second stacked structure (frame)

The invention claimed is:

1. A method of manufacturing an imaging device including a plurality of imaging elements in an imaging area, each of the imaging elements including a photoelectric conversion unit in a substrate and a wire grid polarizer arranged at a light-incident side of the photoelectric conversion unit, the method comprising:

forming the photoelectric conversion unit in the substrate;
forming a light-reflecting layer on or above the photoelectric conversion unit, wherein the light-reflecting layer includes a first electrical conducting material that is electrically connected to at least one of the substrate or the photoelectric conversion unit;
forming a light-absorbing layer on or above the light-reflecting layer, wherein the light-absorbing layer includes a second electrical conducting material, and wherein at least a portion of the light-absorbing layer is in contact with the light-reflecting layer;
patterning the light-absorbing layer and the light-reflecting layer to form the wire grid polarizer including a plurality of stacked strip-shaped portions, wherein each of the plurality of stacked strip-shaped portions includes a portion of the light-reflecting layer and tthe portion of the light-absorbing layer;
setting a potential of the light-reflecting layer to a predetermined potential via the substrate or the photoelectric conversion unit; and
patterning the light-absorbing layer and the light-reflecting layer to form the wire grid polarizer while the potential of the light-reflecting layer is set to the predetermined potential.

2. The method of manufacturing an imaging device according to claim 1, further comprising:
forming an insulating layer on or above the light-reflecting layer; and
forming an opening in the insulating layer, wherein the insulating layer is between the light-reflecting layer and the light-absorbing layer, and wherein each of the plurality of stacked strip-shaped portions includes the portion of the light-reflecting layer, a portion of the insulating layer, and the portion of the light-absorbing layer.

3. The method of manufacturing an imaging device according to claim 1, further comprising:
forming an insulating layer on or above the photoelectric conversion unit;
forming a light-blocking layer on the insulating layer; and
forming an opening in the insulating layer, wherein the light-reflecting layer is in electrical contact with the light-blocking layer.

4. The method of manufacturing an imaging device according to claim 1, wherein an area in which the substrate or the photoelectric conversion unit is electrically connected to the light-reflecting layer is positioned in an imaging area of the imaging device.

5. The method of manufacturing an imaging device according to claim 1, wherein an area in which the substrate or the photoelectric conversion unit is electrically connected to the light-reflecting layer is positioned in an optical black pixel area at an outer circumference of an imaging area of the imaging device.

6. The method of manufacturing an imaging device according to claim 1, wherein an area in which the substrate or the photoelectric conversion unit is electrically connected to the light-reflecting layer is positioned in a peripheral area outside an imaging area of the imaging device.

7. The method of manufacturing an imaging device according to claim 1, wherein the light-reflecting layer and the light-absorbing layer are shared by the plurality of imaging elements in the imaging device.

8. The method of manufacturing an imaging device according to claim 1, wherein the first electrical conducting material includes aluminum (AL) and the second electrical conducting material includes tungsten (W).

9. The method of manufacturing an imaging device according to claim 1, wherein the substrate is made of silicon (Si).

10. The method of manufacturing an imaging device according to claim 1, wherein the plurality of stacked strip-shaped portions extends in a continuous manner above a plurality of photoelectric conversion units.

11. A method of manufacturing an imaging device including a plurality of imaging elements in an imaging area, each of the imaging elements including a photoelectric conversion unit in a substrate and a wire grid polarizer arranged at a light-incident side of the photoelectric conversion unit, the method comprising:
forming the photoelectric conversion unit in the substrate;
forming a light-reflecting layer on or above the photoelectric conversion unit, wherein the light-reflecting layer includes a first electrical conducting material that is electrically connected to at least one of the substrate or the photoelectric conversion unit;
forming a light-absorbing layer on or above the light-reflecting layer, wherein the light-absorbing layer includes a second electrical conducting material, and wherein at least a portion of the light-absorbing layer is in contact with the light-reflecting layer;
patterning the light-absorbing layer and the light-reflecting layer to form the wire grid polarizer including a plurality of stacked strip-shaped portions, wherein each of the plurality of stacked strip-shaped portions includes a portion of the light-reflecting layer and the portion of the light-absorbing layer;
forming an extending portion of the light-reflecting layer which is electrically connected to the substrate or the photoelectric conversion unit; and
electrically connecting the extending portion to a light-blocking layer, provided between the extending portion and the substrate and also disposed between a first imaging element of the plurality of imaging elements and a second imaging element of the plurality of imaging elements that is adjacent to the first imaging element.

12. The method of manufacturing an imaging device according to claim 11, further comprising:
forming an insulating layer on or above the light-reflecting layer; and
forming an opening in the insulating layer, wherein the insulating layer is between the light-reflecting layer and the light-absorbing layer, and wherein each of the of the plurality of stacked strip-shaped portions includes the portion of the light-reflecting layer, a portion of the insulating layer, and the portion of the light-absorbing layer.

13. The method of manufacturing an imaging device according to claim 11, further comprising:
setting a potential of the light-reflecting layer to a predetermined potential via the substrate or the photoelectric conversion unit; and
patterning the light-absorbing layer and the light-reflecting layer to form the wire grid polarizer while the potential of the light-reflecting layer is set to the predetermined potential.

14. The method of manufacturing an imaging device according to claim 11, wherein an area in which the substrate or the photoelectric conversion unit is electrically connected to the light-reflecting layer is positioned in an imaging area of the imaging device.

15. The method of manufacturing an imaging device according to claim 11, wherein an area in which the substrate or the photoelectric conversion unit is electrically connected to the light-reflecting layer is positioned in an optical black pixel area at an outer circumference of an imaging area of the imaging device.

16. The method of manufacturing an imaging device according to claim 11, wherein an area in which the substrate or the photoelectric conversion unit is electrically connected to the light-reflecting layer is positioned in a peripheral area outside an imaging area of the imaging device.

17. The method of manufacturing an imaging device according to claim 11, wherein the first electrical conducting material includes aluminum (AL) and the second electrical conducting material includes tungsten (W).

18. The method of manufacturing an imaging device according to claim 11, wherein the substrate is made of silicon (Si).

19. The method of manufacturing an imaging device according to claim 11, wherein the light-reflecting layer and the light-absorbing layer are shared by the plurality of imaging elements in the imaging device.

20. The method of manufacturing an imaging device according to claim 11, wherein the plurality of stacked strip-shaped portions extends in a continuous manner above a plurality of photoelectric conversion units.

\* \* \* \* \*